(12) United States Patent
Fujita et al.

(10) Patent No.: US 10,505,478 B2
(45) Date of Patent: Dec. 10, 2019

(54) MOTOR MODULE, MOTOR STEP OPERATION CONTROL SYSTEM, AND MOTOR CONTROL DEVICE

(71) Applicant: Nidec Corporation, Kyoto (JP)

(72) Inventors: Atsushi Fujita, Kyoto (JP); Shota Ishigami, Kyoto (JP); Tomohiro Fukumura, Kyoto (JP)

(73) Assignee: NIDEC CORPORATION, Kyoto (JP)

( * ) Notice: Subject to any disclaimer, the term of this patent is extended or adjusted under 35 U.S.C. 154(b) by 0 days.

(21) Appl. No.: 16/099,464

(22) PCT Filed: Feb. 27, 2017

(86) PCT No.: PCT/JP2017/007391
§ 371 (c)(1),
(2) Date: Nov. 7, 2018

(87) PCT Pub. No.: WO2017/195435
PCT Pub. Date: Nov. 16, 2017

(65) Prior Publication Data
US 2019/0222152 A1 Jul. 18, 2019

(30) Foreign Application Priority Data

May 9, 2016 (JP) .................................. 2016-093728

(51) Int. Cl.
*H02P 8/22* (2006.01)
*H02P 8/08* (2006.01)

(52) U.S. Cl.
CPC . *H02P 8/22* (2013.01); *H02P 8/08* (2013.01)

(58) Field of Classification Search
CPC ........ G05B 19/40; G05B 11/01; G05B 11/28; H02P 1/00; H02P 1/04; H02P 1/46;
(Continued)

(56) References Cited

U.S. PATENT DOCUMENTS

2010/0109655 A1   5/2010   Tanaka et al.
2013/0106326 A1   5/2013   Kamatani et al.
(Continued)

FOREIGN PATENT DOCUMENTS

JP   01-291690 A   11/1989
JP   06-351297 A   12/1994
(Continued)

OTHER PUBLICATIONS

Official Communication issued in International Patent Application No. PCT/JP2017/007391, dated May 23, 2017.

*Primary Examiner* — Anthony M Paul
(74) *Attorney, Agent, or Firm* — Keating & Bennett, LLP

(57) ABSTRACT

In one implementation, a motor module according to the present invention includes: a motor driving circuit 10 to drive a motor M; and a position estimation device 30 to output an estimated position signal of a rotor R of the motor M. It also includes: a motor control circuit 20 to supply a command voltage value to the motor driving circuit 10 in response to a pulse signal; and a variable step-size memory 40 storing variable step-size information, which defines an amount of displacement of the rotor R per pulse of the pulse signal. The estimated position signal is an analog or digital signal. Upon receiving a pulse signal, the motor control circuit 20 determines the command voltage value based on an estimated position value of the rotor R acquired from the position estimation device 30 and the variable step-size information read from the variable step-size memory 40. The motor driving circuit 10 changes the position of the rotor R based on the command voltage value.

16 Claims, 17 Drawing Sheets

(58) Field of Classification Search
CPC ...... H02P 3/00; H02P 3/18; H02P 8/00; H02P 21/00; H02P 23/00; H02P 27/00; H02P 27/04; H02P 27/06; H02P 6/00; H02P 6/14; H02K 29/08; H02K 29/12
USPC ..... 318/685, 696, 400.01, 400.02, 700, 701, 318/721, 779, 799, 800, 801, 430, 437
See application file for complete search history.

(56) References Cited

U.S. PATENT DOCUMENTS

| 2014/0039829 | A1 | 2/2014 | Kubota et al. |
| 2014/0361715 | A1* | 12/2014 | Murata ................ H02P 6/18 318/400.02 |
| 2017/0343382 | A1 | 11/2017 | Fukumura et al. |

FOREIGN PATENT DOCUMENTS

| JP | 09-047071 | A | 2/1997 |
| JP | 09-121584 | A | 5/1997 |
| JP | 2009-055649 | A | 3/2009 |
| JP | 2011-114951 | A | 6/2011 |
| JP | 2013-099023 | A | 5/2013 |
| JP | 2014-032154 | A | 2/2014 |
| JP | 2015-019563 | A | 1/2015 |
| WO | 2008/050550 | A1 | 5/2008 |
| WO | 2016/104378 | A1 | 6/2016 |

* cited by examiner

MOTOR MODULE, MOTOR STEP OPERATION CONTROL SYSTEM, AND MOTOR CONTROL DEVICE

TECHNICAL FIELD

The present application relates to a motor module, a motor step operation control system, and a motor control device. Moreover, the present application also relates to a device and a motor step operation control system including the motor module.

BACKGROUND ART

A stepping motor is able to change the position and speed of its rotor in response to a pulse signal that is input from an external device. Stepping motors are widely used in devices such as printers, scanners, copiers, and multifunction products. However, as compared to e.g. brushless DC motors, stepping motors have problems such as significant vibration and noise, low efficiency of energy conversion, and loss of synchronization.

Japanese Laid-Open Patent Publication No. 2015-19563 discloses an image forming device having a brushless DC motor instead of a stepping motor. Upon receiving a pulse signal that designates the position of the rotor, the brushless DC motor in this device rotates the rotor by a unit step angle for each pulse. A signal (rotary position detection signal) indicating the position of the rotor of the brushless DC motor is generated by converting a magnetic pole phase signal which is output from the brushless DC motor. This rotary position detection signal is a two-phased pulse sequence which is equivalent to a signal that is output from a known rotary encoder.

CITATION LIST

Patent Literature

Patent Document 1: Japanese Laid-Open Patent Publication No. 2015-19563

SUMMARY OF INVENTION

Technical Problem

In accordance with the device which is disclosed in Japanese Laid-Open Patent Publication No. 2015-19563, the rotor position changes by a fixed unit step angle. The size of this unit step angle may be equal to the pulse cycle of the rotary position detection signal, or an integer (which is two or greater) multiple of the pulse cycle.

The present disclosure provides a motor module, motor step operation control system, and motor control device in which the amount of displacement of the rotor per pulse is variable.

Solution to Problem

In one implementation, a motor module according to the present disclosure comprises: a motor having a mover and a stator; a motor driving circuit to drive the motor; a position estimation device to output an analog or digital estimated position signal indicating an estimated position value of the mover; a motor control circuit being connected to the motor driving circuit to supply a command voltage value to the motor driving circuit in response to a pulse signal; and a memory storing variable step-size information, the variable step-size information defining an amount of displacement of the mover per pulse of the pulse signal. Upon receiving the pulse signal, the motor control circuit determines the command voltage value based on the estimated position value of the mover acquired from the position estimation device and the variable step-size information read from the memory. The motor driving circuit changes a position of the mover based on the command voltage value.

In one implementation, an apparatus according to the present disclosure comprises: the above motor module; a mechanical part connected to the motor of the motor module; and a controller to input the pulse signal to the motor control circuit.

In one implementation, a motor step operation control system according to the present disclosure comprises: a motor driving circuit to drive a motor having a mover and a stator; a position estimation device to output an analog or digital estimated position signal indicating an estimated position value of the mover; a motor control circuit being connected to the motor driving circuit to supply a command voltage value to the motor driving circuit in response to a pulse signal; and a memory storing variable step-size information, the variable step-size information defining an amount of displacement of the mover per pulse of the pulse signal. Upon receiving the pulse signal, the motor control circuit determines the command voltage value based on the estimated position value of the mover acquired from the position estimation device and the variable step-size information read from the memory. The motor driving circuit changes a position of the mover based on the command voltage value.

In one implementation, a motor control device according to the present disclosure is a motor control device for use while being connected to a motor driving circuit which drives a motor having a mover and a stator and to a position estimation device which outputs an analog or digital estimated position signal indicating an estimated position value of the mover, the motor control device comprising: a control circuit to generate a command voltage value based on a command position value and the estimated position value, and supply the command voltage value to the motor driving circuit; a memory storing variable step-size information, the variable step-size information defining an amount of displacement of the mover per pulse of a pulse signal that is input from an external device; and a command position value generation circuit to generate the command position value based on the pulse signal and the variable step-size information.

In one implementation, a step operation control method according to the present disclosure is a step operation control method for a motor having a mover and a stator, the step operation control method comprising: with a motor control device, generating an analog or digital estimated position signal indicating an estimated position value of the mover; with the motor control device, acquiring variable step-size information from a memory, the variable step-size information defining an amount of displacement of the mover per pulse of a pulse signal that is input from an external device; with the motor control circuit, receiving a pulse signal from the external device, and generating the command voltage value based on the estimated position value of the mover and the variable step-size information; and with the motor driving circuit, changing a position of the mover in variable steps, based on the command voltage value.

Advantageous Effects of Invention

According to an embodiment of the present invention, by modifying "variable step-size information" which is recorded in a memory, the amount of displacement (which typically is a step angle) of a rotor per pulse can be changed. In accordance with an embodiment of the present invention, without changing the mechanical structure of the motor, the amount of displacement of the rotor per pulse can be made equal to a desired size. Without changing the mechanical structure of the motor, such a modification of the step size can be made by updating data in the memory, or with a signal input or a switching operation from an external device.

DESCRIPTION OF EMBODIMENTS

In the following, unless otherwise specified, the superscript * indicates a command value. On the other hand, the hat symbol ^ indicates an estimated value. In the present disclosure, CW rotation means clockwise rotation as viewed from the output shaft of the motor. CCW rotation means counterclockwise rotation as viewed from the output shaft of the motor.

First, with reference to FIG. 1, an exemplary fundamental construction of a motor module according to the present disclosure will be described.

Figure 1:
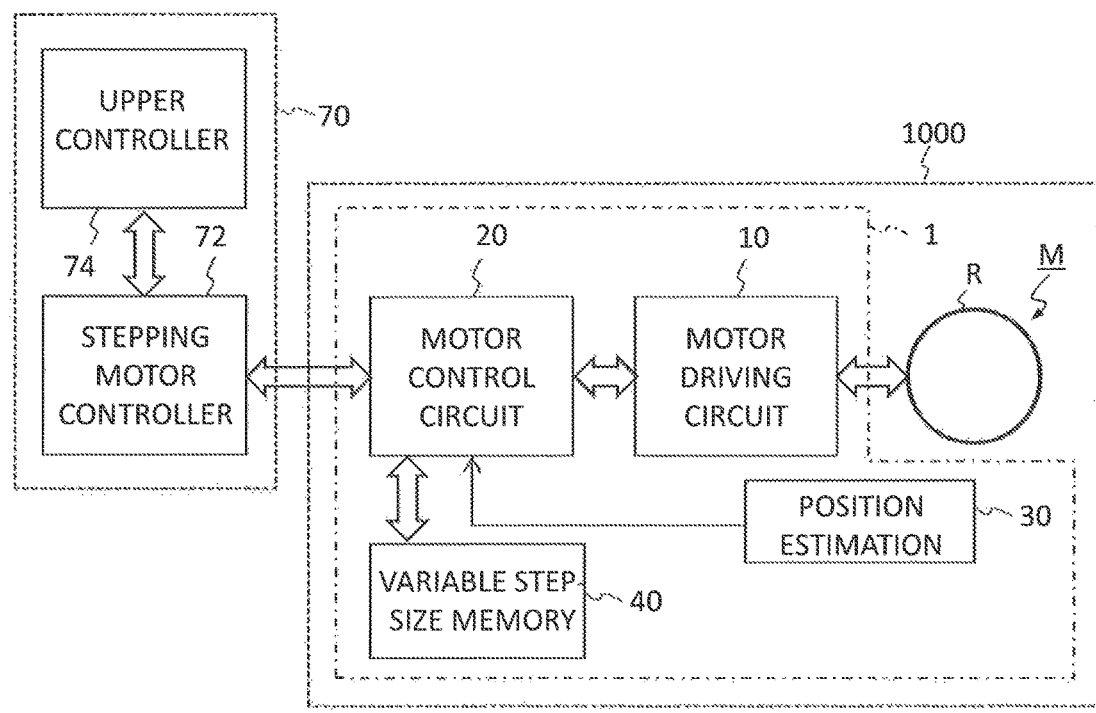
FIG. 1 is a block diagram showing an exemplary fundamental construction of a motor module according to the present disclosure.

A motor module 1000 which is illustrated in FIG. 1 includes a motor M and a motor step operation control system 1 to control operation of the motor M. The motor M includes a rotor R and a stator not shown. A typical example of the motor M in the present disclosure is a brushless DC motor, and not a stepping motor. The motor step operation control system 1, which includes a motor driving circuit 10 to drive the motor M and a motor control circuit 20 that is connected to the motor driving circuit 10, is able to cause the motor M to perform step operations. In FIG. 1, double-headed blank arrows are indicated between blocks. These arrows do not mean that information such as signals or data may always move bidirectionally. For example, between the motor driving circuit 10 and the motor control circuit 20, a signal may be sent unidirectionally from the motor control circuit 20 to the motor driving circuit 10.

The motor module 1000 is connected to an external device 70. The external device 70 in this example includes a stepping motor controller 72 and an upper controller 74 to control the stepping motor controller 72. The stepping motor controller 72 outputs a pulse signal for driving a usual stepping motor. Receiving this pulse signal, the motor control circuit 20 is able to cause the motor M, which is not a stepping motor, to perform step operations. Based on a command voltage value which is output from the motor control circuit 20, the motor driving circuit 10 supplies a voltage which is necessary for the operation of the motor M. The motor driving circuit 10 includes an inverter circuit and a predriver, for example. The inverter circuit may be a bridge circuit that includes a plurality of power transistors. As the command voltage value, the motor driving circuit 10 typically receives a pulse width modulation (PWM) signal from the motor control circuit 20, and supplies a pseudo sine wave voltage to the motor M.

In the case where the motor module 1000 according to the present disclosure is used for a multifunction product, for example, the external device 70 includes various control circuits in addition to the stepping motor controller 72. Generally speaking, such control circuits can be implemented by a single or plural application specific integrated circuit chip(s), together with the stepping motor controller 72. Therefore, when a stepping motor in a conventional multifunction product is replaced by another motor (e.g. a brushless DC motor), it is difficult to change the functionality of the stepping motor controller 72 so as to be adapted for the operation of the brushless DC motor. Based on the construction of the motor module 1000 according to the present disclosure, it can even be used by changing the stepping motor being to another type of motor M, without changing the fundamental design of the external device 70 which has been manufactured on the premise of utilizing a stepping motor.

The illustrated motor module 1000 further includes a position estimation device 30 to output an estimated position signal for the rotor R and a variable step-size memory 40 that stores variable step-size information. The estimated position signal is a signal indicating an estimated position value of the rotor R. The estimated position signal is input from the position estimation device 30 to the motor control circuit 20. The estimated position signal which is output from the position estimation device 30 according to the present embodiment is not a pulse sequence, but has a magnitude which linearly changes in accordance with the position of the rotor R. In this respect, the estimated position signal according to the present disclosure is significantly different from a rotary position detection signal that is output from any known rotary encoder. Examples of estimated position signals will be later described in outline with reference to FIG. 3B.

As described earlier, a typical example of the signal that is output from a rotary encoder is a two-phased pulse sequence. When the position of the rotor R is to be controlled based on a two-phased pulse sequence, it is impossible to control the position of the rotor R with a resolution which is narrower than the pulse interval of the two-phased pulse sequence. However, as will be described later, in an embodiment of a motor module according to the present disclosure, the estimated position signal has a magnitude which linearly changes in accordance with changes in the position (mechanical angle) of the rotor R. This allows positioning of the rotor R to be made without being constrained by the resolution of the rotary encoder. As a result, it becomes possible to freely change the "amount of rotor displacement (step size)" per pulse of a pulse signal that is sent out from the external device 70.

Information which defines an "amount of displacement of the rotor" per pulse of a pulse signal that is input from the external device 70, i.e., "variable step-size information", is stored in the variable step-size memory 40. Conventionally, the amount of displacement (rotation angle) of a rotor of a stepping motor per pulse of a pulse signal is referred to as a "step angle". For example, when the step angle is 0.9°, the amount of displacement of the rotor per pulse of a pulse signal is 0.9°. In the conventional stepping motor, the smallest unit of step angle is determined by the mechanical structure of the motor. When using a stepping motor whose step angle has a smallest unit of 0.9°, positioning of the rotor cannot be effected with any angle that is smaller than 0.9°. However, an embodiment of the present disclosure allows the amount of displacement of the rotor per pulse of a pulse signal to be determined without being constrained by the mechanical structure of the motor. Details thereof will be described later.

Upon receiving a pulse signal from the external device 70, the motor control circuit 20 according to the present disclosure determines a command voltage value based on an estimated position value of the rotor R that is acquired from the position estimation device 30, and the variable step-size information that is read from the variable step-size memory 40. Based on this command voltage value, the motor driving circuit 10 drives the motor M to change the position of the rotor R.

Figure 2:
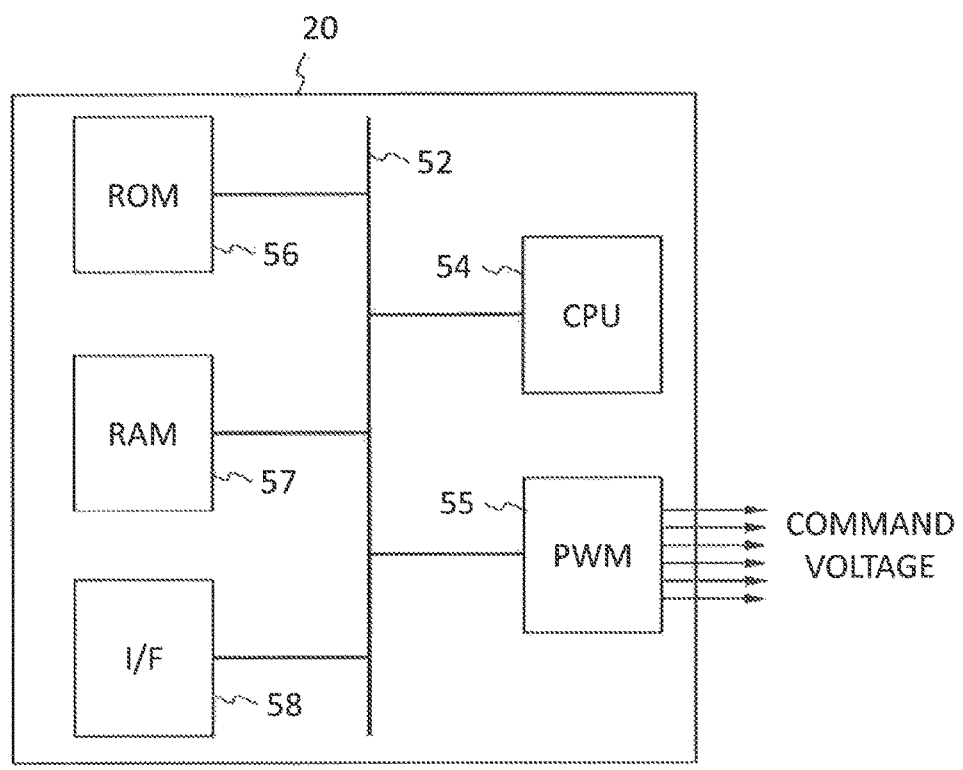
FIG. 2 is a diagram showing an exemplary hardware construction of a motor control circuit 20 in a motor module according to the present disclosure.

The motor control circuit 20 may have a hardware construction shown in FIG. 2, for example. The motor control circuit 20 in this example includes a CPU (central processing unit) 54, a PWM circuit 55, a ROM (read only memory) 56, a RAM (random access memory) 57, and an I/F (input/output interface) 58, which are connected with one another via a bus. Other circuits or devices (e.g., AD converters) not shown may additionally be connected to the bus. The PWM circuit 55 supplies a PWM signal to the motor driving circuit 10 of FIG. 1. The program and data that define the operation of the CPU 54 are stored in at least one of the ROM 56 and the RAM 57. The motor control circuit 20 as such may be implemented by a general-purpose 32-bit microcontroller, for example. Such a microcontroller may be constructed from one or plural integrated circuit chip(s), for example.

Although the aforementioned variable step-size memory 40 is shown to be separate from the motor control circuit 20 in FIG. 1, a portion of at least one of the ROM 56 and the RAM 57 in the motor control circuit 20 may realize the variable step-size memory 40. The motor control circuit 20 may realize a part or a whole of the functionality of the position estimation device 30.

Details of various operations to be performed by the motor control circuit 20 will be described later. Typically, various operations to be performed by the motor control circuit 20 are defined by a program. By updating a part or a whole of the content of the program, a part or a whole of the operation of the motor control circuit 20 can be changed. Such program updates may be performed by using a storage medium storing the program, or made via wired or wireless communications. Communications may be performed by using the I/F 58 of FIG. 2. In order to reduce the amount of calculations by the CPU 54 shown in FIG. 2, part of the various operations to be performed by the motor control circuit 20, e.g., part of vector calculations, may be executed by hardware circuitry that is dedicated to such calculations.

Figure 3A:
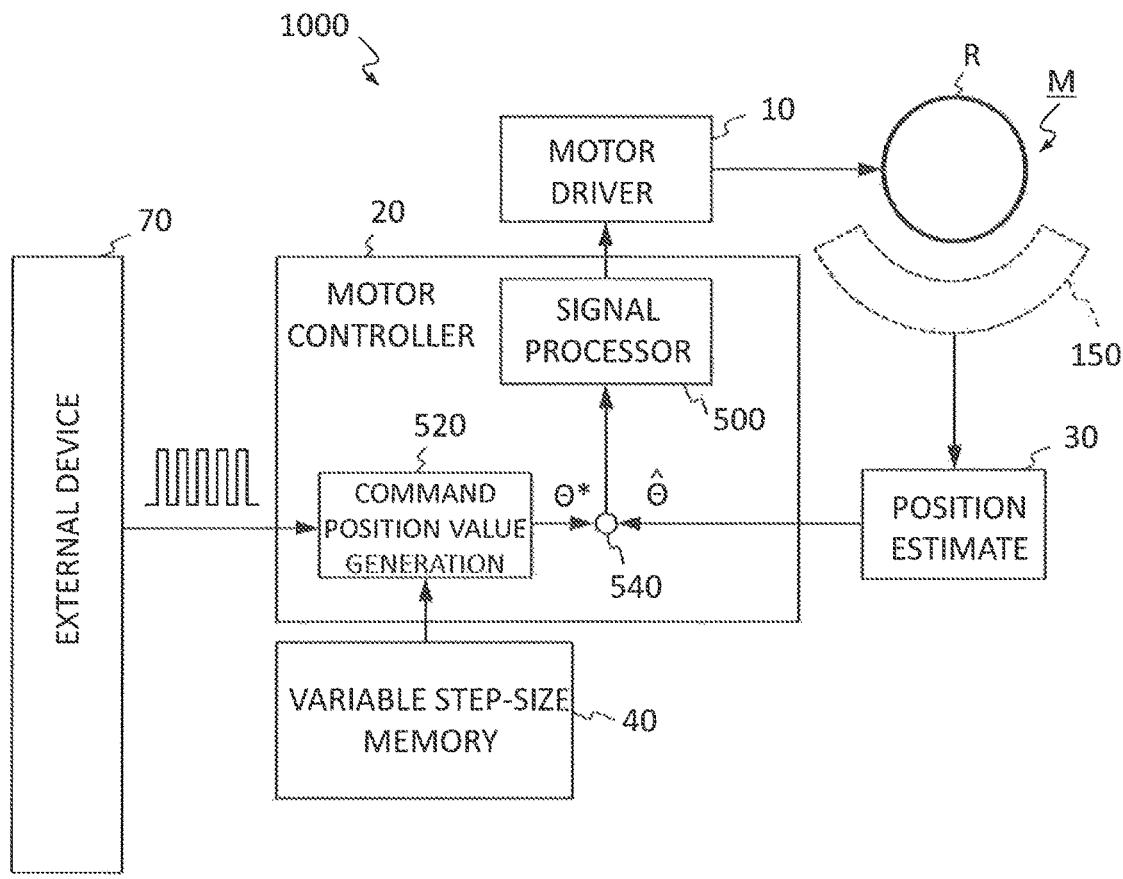
FIG. 3A is a diagram schematically showing functional blocks in the motor control circuit 20.

FIG. 3A is a diagram schematically showing the functional blocks in the motor control circuit 20. The illustrated motor control circuit 20 includes a signal processing circuit 500, a command position value generation circuit 520, and an arithmetic unit 540. The command position value generation circuit 520 generates a command position value Θ* based on a pulse signal that is input from the external device 70, and inputs it to the arithmetic unit 540.

To the arithmetic unit 540, an estimated position value Θ^ that is output from the position estimation device is also input. The position estimation device 30 estimates the position of the rotor R based on a signal from a detection device 150 that senses the position of the rotor R. For example, when the command position value Θ* is 45.5° and the estimated position value Θ^ is 30°, the arithmetic unit 540 and the signal processing circuit 500 calculate a command voltage value for causing the rotor R to move (rotate) from a Θ=30° position to a Θ=45.5° position. As this command voltage value, an appropriate value is calculated in accordance with the displacement of the rotor R, and is supplied to the motor driving circuit 10 at intervals of e.g. about 50 microseconds. Until the estimated position value Θ^ received from the position estimation device 30 equals the command position value Θ*, the motor control circuit 20 controls the motor driving circuit 10 to drive the motor M. When the motor control circuit 20 outputs a PWM signal as the command voltage value, the cycle with which to output the command voltage value may be referred to as a "PWM cycle".

Figure 3B:
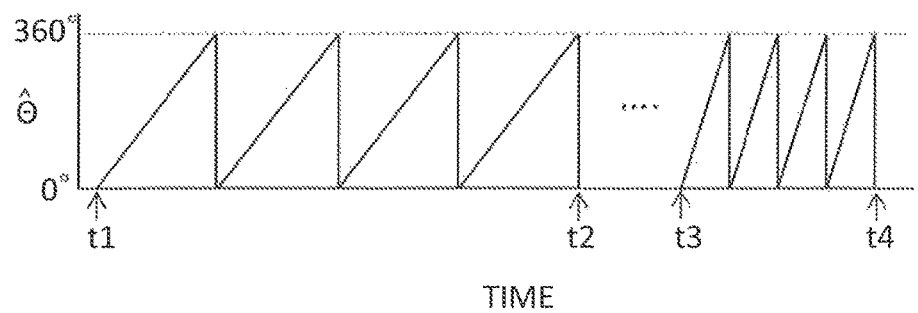
FIG. 3B is a diagram showing a signal indicating an estimated position value $\hat{\Theta}$ of a rotor R which is output from a position estimation device 30.

FIG. 3B is a diagram showing an exemplary waveform of a signal indicating the estimated position value Θ^ that is output from the position estimation device 30. While the mechanical angle of the rotor R increases from 0° to 360°, the magnitude of the signal indicating the estimated position value Θ^ linearly increases from zero to a predetermined value. Stated otherwise, while the rotor R makes one turn, the signal indicating the estimated position value Θ^ continuously and linearly changes in magnitude. When the rotor R rotates by 2 turns or more, the magnitude of the signal indicating the estimated position value Θ^ undergoes cyclic changes. This cycle coincides with the amount of time for the rotor R to make one turn. Moreover, the signal indicating the estimated position valueΘ^ has a magnitude that differs in accordance with the mechanical angle position of the rotor R. From the magnitude of the signal indicating the estimated position value Θ^, the mechanical angle (position) of the rotor R can be uniquely identified.

In the example of FIG. 3B, in a period from time t1 to time t2, the rotor R makes 4 turns with a constant rotational speed. In a period from time t3 to time t4, the rotor R makes 4 turns with a constant rotational speed. The rotational speed in the period from time t3 to time t4 is higher than the rotational speed in the period from time tl to time t2.

Figure 4A:
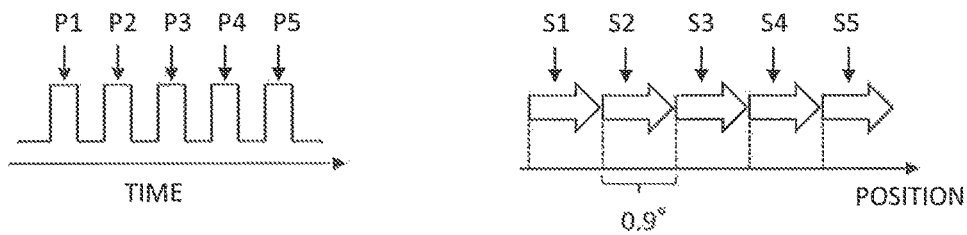
FIG. 4A is a diagram schematically showing a relationship between: an exemplary waveform (left side) of a pulse signal which is supplied from an external device 70 of FIG. 1 to a motor module 1000; and displacement (right side) of the rotor R.

FIG. 4A is a diagram schematically showing a relationship between: an exemplary waveform (left side) of a pulse signal that is supplied from the external device 70 of FIG. 1 to the motor module 1000; and displacement (right side) of the rotor R. In this example, from the stepping motor controller 72 of the external device 70, the motor control circuit 20 of the motor module 1000 consecutively receives pulse P1, pulse P2, pulse P3, pulse P4, and pulse P5.

Such pulses may be input to the motor control circuit 20 at a rate of e.g. several dozens to several hundreds of thousands in 1 second. The rotor R rotates in response to the pulse signal. In FIG. 4A, the amount of displacement of the rotor R per pulse, i.e., step angles S1 through S5, is 0.9°.

Figure 4B:
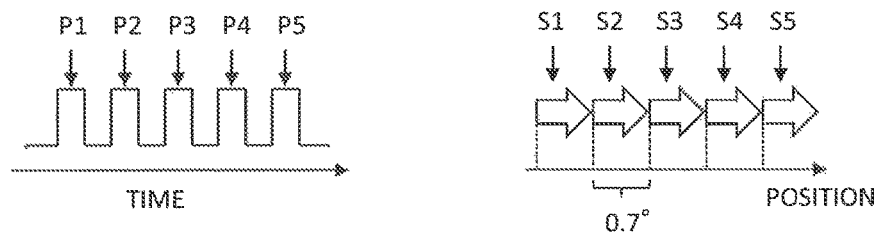
FIG. 4B is a diagram schematically showing another exemplary relationship between: an exemplary waveform (left side) of a pulse signal which is supplied from the external device 70 to the motor module 1000; and displacement (right side) of the rotor R.
Figure 4C:
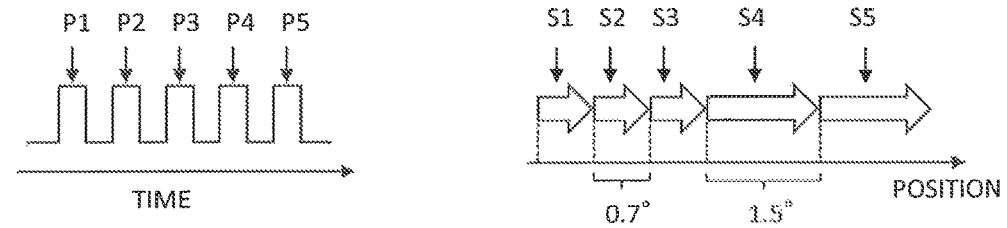
FIG. 4C is a diagram schematically showing still another exemplary relationship between: an exemplary waveform (left side) of a pulse signal which is supplied from the external device 70 to the motor module 1000; and displacement (right side) of the rotor R.
Figure 4D:
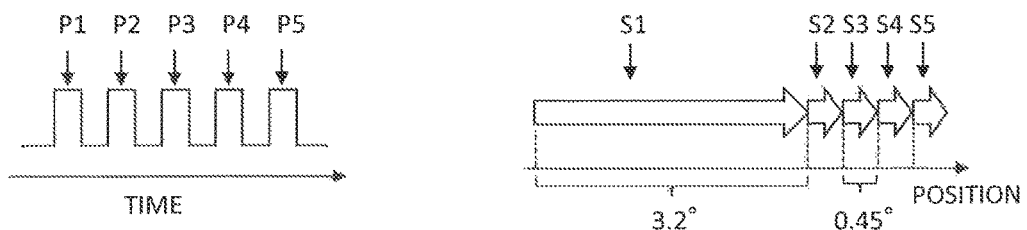
FIG. 4D is a diagram schematically showing still another exemplary relationship between: an exemplary waveform (left side) of a pulse signal which is supplied from the external device 70 to the motor module 1000; and displacement (right side) of the rotor R.

FIG. 4B, FIG. 4C, and FIG. 4D are each a diagram schematically showing another exemplary relationship between: an exemplary waveform (left side) of a pulse signal that is supplied from the external device 70 of FIG. 1 to the motor module 1000; and displacement (right side) of the rotor R. In any of these examples, the exemplary waveform (left side) of the pulse signal that is supplied from the external device 70 to the motor module 1000 is identical. The hardware of the motor module 1000 is identical among the examples of FIGS. 4A through 4D. However, in the example of FIG. 4B, the amount of displacement of the rotor R per pulse, i.e., step angles S1 through S5, is 0.7°, unlike in the example of FIG. 4A. Such modification of the step angle is realized through modification of the variable step-size information that is used in the calculation. Setting or modification of this variable step-size information may be performed for each motor module 1000 during production or shipment of the motor modules 1000, or may be performed for each individual motor module 1000 during boot or operation thereof. In the following examples, the variable step-size information is modified during operation.

In the example of FIG. 4C, the amount of displacement of the rotor R per pulse, i.e., the step angle, is 0.7° for pulses P1 through P3, but 1.5° for pulses P4 and P5. In this example, the step angle is changing during operation. Before and after this change, it is not that one step angle is an integer multiple of the other step angle. In the example of FIG. 4D, the amount of displacement of the rotor R per pulse, i.e., the step angle, is 3.2° for pulse P1, and 0.45° for pulses P2 through P5. The amount of displacement of the rotor R per pulse may be made extremely large. For example, in response to one pulse, the rotor R may be moved by one turn (360°), or even more.

Figure 5A:
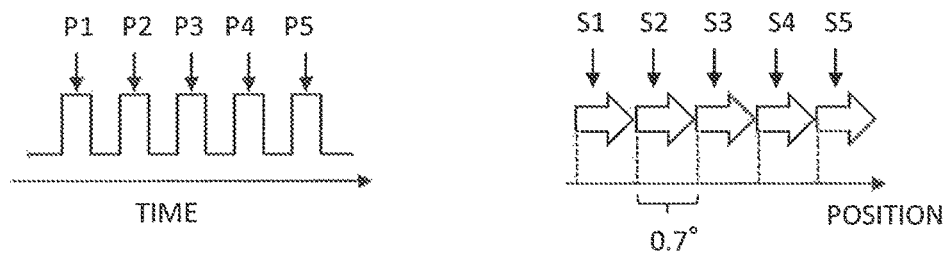
FIG. 5A is a diagram schematically showing still another relationship between: an exemplary waveform (left side) of a pulse signal which is supplied from the external device 70 to the motor module 1000; and displacement (right side) of the rotor R.
Figure 5B:
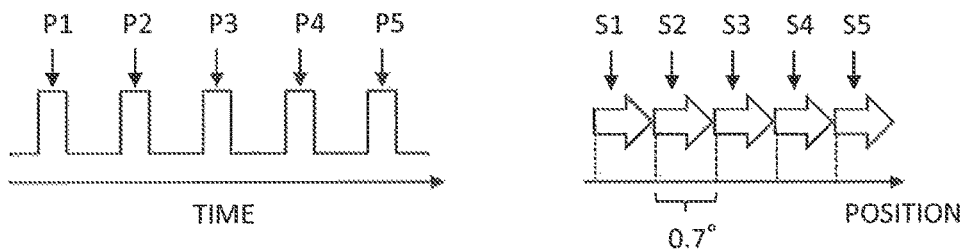
FIG. 5B is a diagram schematically showing still another exemplary relationship between: an exemplary waveform (left side) of a pulse signal which is supplied from the external device 70 to the motor module 1000; and displacement (right side) of the rotor R.

FIG. 5A and FIG. 5B are each a diagram schematically showing a relationship between: an exemplary waveform (left side) of a pulse signal that is supplied from the external device 70 of FIG. 1 to the motor module 1000; and displacement (right side) of the rotor R. The difference between the example of FIG. 5A and the example of FIG. 5B lies in the pulse rate of the pulse signal that is supplied from the external device 70 to the motor module 1000. A pulse rate means the number of pulses to be input to the motor module 1000 per unit time. A pulse rate may also be referred to as a "pulse frequency". The pulse rate of the pulse signal shown in FIG. 5B is lower than the pulse rate of the pulse signal shown in FIG. 5A. Between the examples of FIG. 5A and FIG. 5B, the step angle is equally 0.7°, but the pulse rates are different, thus resulting in different rotational speeds (velocities of displacement) of the rotor R. More specifically, as the pulse rate increases, the rotational speed of the rotor R increases.

Figure 6:
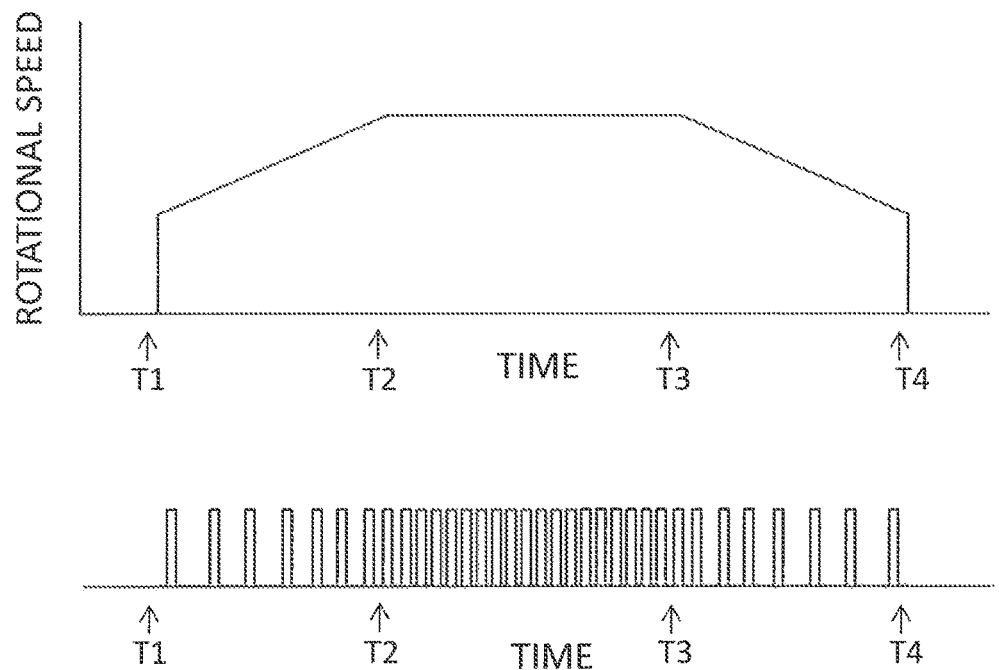
FIG. 6 includes a graph (TOP) showing a relationship between rotational speed of the rotor R and time, and a diagram showing an exemplary waveform (BOTTOM) of a pulse signal which is supplied from the external device 70 to the motor module 1000.

FIG. 6 includes a graph (TOP) showing a relationship between rotational speed of the rotor R and time, and a diagram showing an exemplary waveform (BOTTOM) of a pulse signal which is supplied from the external device 70 to the motor module 1000. In the period from time T1 to time T2, the pulse rate linearly increases, and consequently the rotational speed of the rotor R also increases. In the period from time T2 to time T3, the pulse rate is constant, and the rotational speed of the rotor R is also constant. Furthermore, in the period from time T3 to time T4, the pulse rate linearly decreases, and consequently the rotational speed of the rotor R also decreases. Thus, the rotational speed of the rotor R can be controlled on the basis of the pulse rate of the pulse signal.

Figure 7:
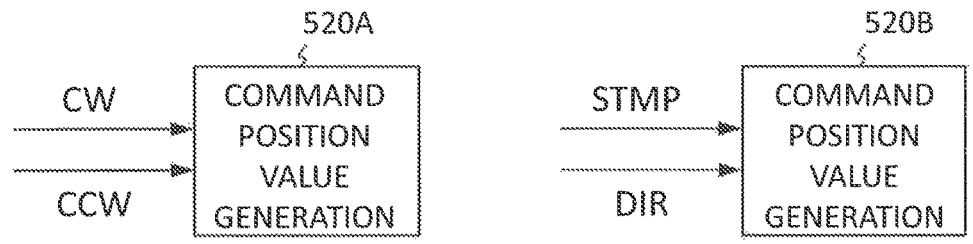
FIG. 7 is a diagram showing examples of command position value generation circuits 520A and 520B which are capable of receiving a signal that designates a rotation direction for the rotor R.

To the motor module 1000, a signal that designates a rotation direction for the rotor R may be input from the external device 70. FIG. 7 shows examples of the command position value generation circuit 520 which are capable of receiving a signal that designates a rotation direction for the rotor R. The command position value generation circuit 520A shown on the left side of FIG. 7 includes a CW terminal and a CCW terminal. The command position value generation circuit 520B shown on the right side of FIG. 7 includes an STMP terminal and a DIR terminal. In the present disclosure, designation of a rotation direction of the rotor R may utilize either command position value generation circuit 520.

Next, with reference to FIGS. 8A through 8C, examples of external input signals to be supplied to the input terminals of the command position value generation circuit 520 will be described.

Figure 8A:
FIG. 8A is a diagram showing waveforms of signals to be input to a CW terminal and a CCW terminal of the command position value generation circuit 520A.

FIG. 8A is a diagram showing waveforms of signals to be input to the CW terminal and the CCW terminal of the command position value generation circuit 520A. In the example shown in FIG. 8A, the rotation direction of the rotor R differs between the case where a pulse signal is input to the CW terminal of the command position value generation circuit 520A and the case where a pulse signal is being input to the CCW terminal. For example, when a pulse signal is being input to the CW terminal, the rotor R rotates in a first direction; when a pulse signal is being input to the CCW terminal, the rotor R rotates in a second direction which is opposite to the first direction.

Figure 8B:
FIG. 8B is a diagram showing another example of waveforms of signals to be input to an STMP terminal and a DIR terminal of the command position value generation circuit 520B.

FIG. 8B is a diagram showing another example of waveforms of signals to be input to the STMP terminal and the DIR terminal of the command position value generation circuit 520B. In the example shown in FIG. 8B, the pulse signal is input to the STMP terminal of the command position value generation circuit 520B. Depending on whether a logic "LOW" signal or a logic "HIGH" signal is supplied to the DIR terminal, the rotation direction of the rotor R differs. For example, when a logic "LOW" signal is being supplied to the DIR terminal, the rotor R rotates in a first direction. When a logic "HIGH" signal is being supplied to the DIR terminal, the rotor R rotates in a second direction which is opposite to the first direction.

Figure 8C:
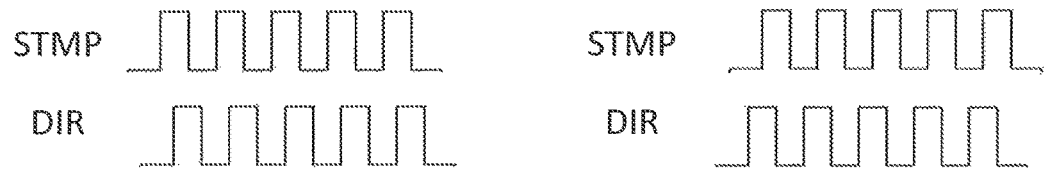
FIG. 8C is a diagram showing still another example of waveforms of signals to be input to an STMP terminal and a DIR terminal of the command position value generation circuit 520B.

FIG. 8C is a diagram showing another example of waveforms of signals to be input to the STMP terminal and the DIR terminal of the command position value generation circuit 520B. In the example shown in FIG. 8C, two-phased pulse signals are supplied to the STMP terminal and DIR terminal of the command position value generation circuit 520B. Depending on the phase lead/lag, the rotation direction of the rotor R differs. For example, when the phase of the pulse signal that is input to the STMP terminal is leading relative to the phase of the pulse signal that is input to the DIR terminal, the rotor R rotates in a first direction. When the phase of the pulse signal that is input to the STMP terminal is lagging behind the phase of the pulse signal that is input to the DIR terminal, the rotor R rotates in a second direction which is opposite to the first direction.

The above waveforms and terminal constructions for the command position value generation circuit 520 merely illustrate typical examples, and do not limit embodiments of the present disclosure.

Figure 9:
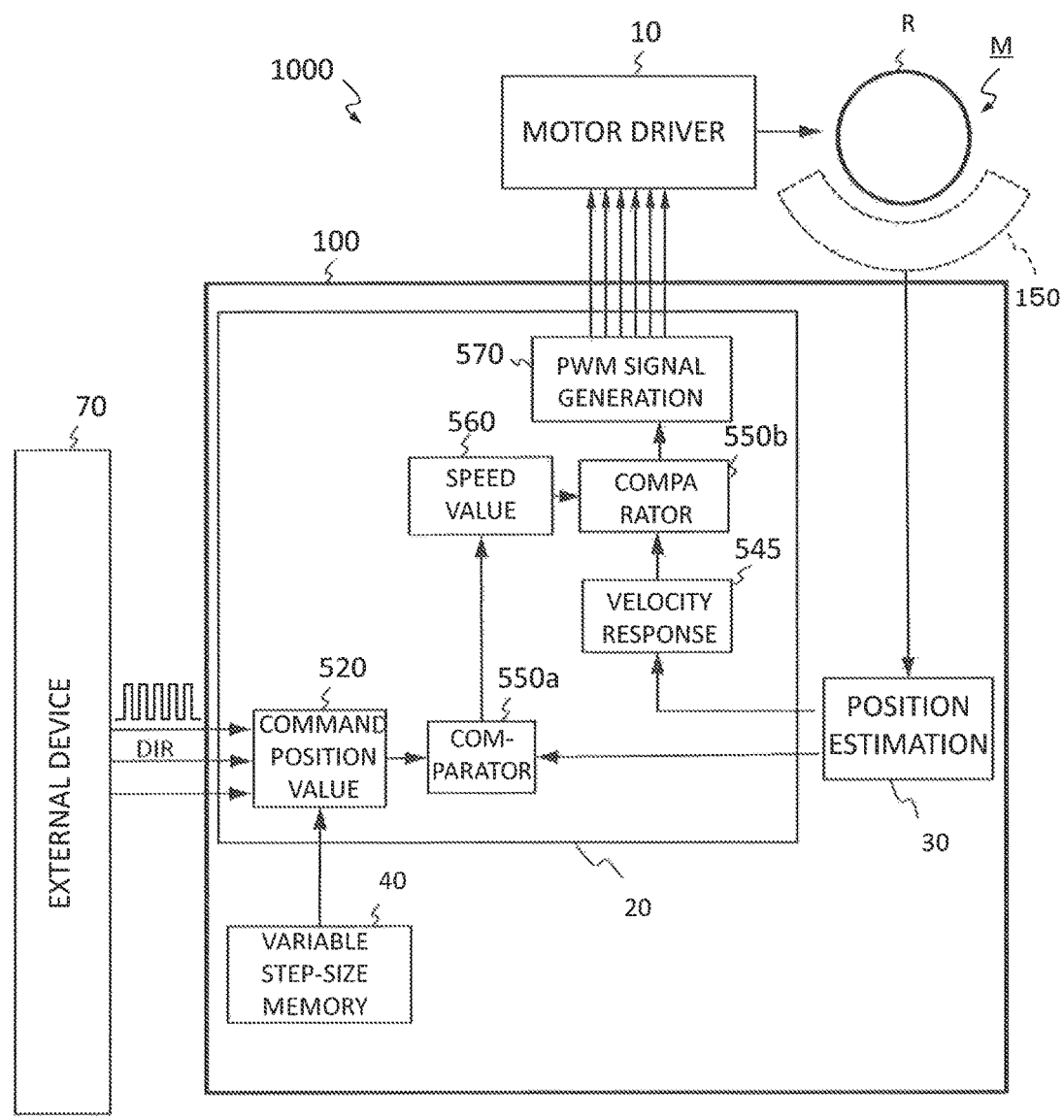
FIG. 9 is a diagram showing an exemplary detailed construction of a functional block of the motor control circuit 20 according to the present disclosure.

Next, with reference to FIG. 9, the motor control circuit 20 will be described in more detail. FIG. 9 is a diagram showing an exemplary construction of a functional block of the motor control circuit 20 according to the present disclosure. In this example, the motor control circuit 20, the position estimation device 30, and the variable step-size memory 40 are implemented by a microcontroller. In the present application, such a microcontroller may be referred to as a "motor control device", indicated by reference numeral "100".

The motor control circuit 20 shown in FIG. 9 includes the command position value generation circuit 520, a command speed value generation circuit 545, comparators 550a and 550b, and a command speed value generation circuit 560. In FIG. 9, for simplicity, the term "circuit" is omitted after each component element.

Figure 10:
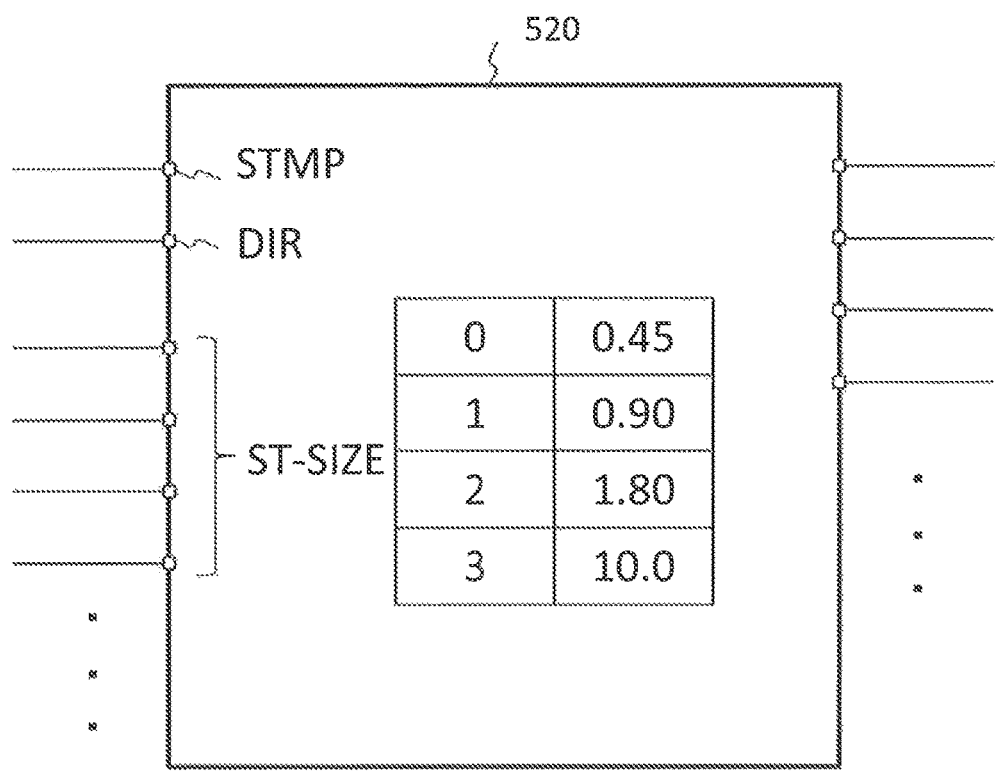
FIG. 10 is a block diagram showing an exemplary construction of the command position value generation circuit 520.

The command position value generation circuit 520 receives a pulse signal that is exemplified in FIG. 8A, 8B or 8C, for example, and generates a command position value $\Theta^*$. The command position value generation circuit 520 may store the contents of the variable step-size memory 40 as a table. For example, the command position value generation circuit 520 may have a construction as shown in FIG. 10. In the example shown in FIG. 10, the command position value generation circuit 520 includes a memory, exhibiting the same function as a variable step-size memory, in the form of a table. The command position value generation circuit 520 has plurality of terminals for receiving signals (external signals) that are output from the external device 70 of FIG. 1. These plural terminals include an STMP terminal, a DIR terminal, and ST-SIZE terminals.

The STMP terminal and DIR terminal receive pulse signals from the stepping motor controller 72 of FIG. 1, as described above. The ST-SIZE terminals receive from the external device 70 external signals designating step sizes. This external signal designating a step size specifies a number in the table that is included in the command position value generation circuit 520, such that a value (table value) that is determined according to this number will be read. The numbers in the table may be "0", "1", "2" and "3", for example. The numbers "0", "1", "2" and "3" in the table respectively have the values "0.45", "0.90", "1.80" and "10.0", for example. These plural table values are candidate values for the step size (step angle).

A signal indicating a table number may be output from the upper controller 74 in the external device 70 of FIG. 1, for example. In the example shown in FIG. 10, table numbers "0", "1", "2" and "3" are respectively assigned to the four ST-SIZE terminals. From the external device 70, as a signal designating a step size, e.g. a logic "HIGH" potential is supplied to one of the four ST-SIZE terminals, whereas e.g. a logic "LOW" potential is supplied to the other three terminals. If a table value "0.45" is assigned to the one ST-SIZE terminal having a logic "HIGH" voltage being supplied thereto, a step size of 0.45° is adopted. Determination of the step size may be made upon boot, for example. Alternatively, the step size may be modified during operation. The motor control device 100 my include a pin(s) or an interface for selecting an arbitrary one among the plurality of candidate values that are stored in the variable step-size memory 40.

Designation of a table number may be made based on data of 1 bit or more. In that case, based on m ST-SIZE terminals, any one value among $2^m$ candidates of step size can be designated. Moreover, designation of a table number may be made via communication means, e.g., serial communications. Such designation of a step size may be performed by the upper controller 74 in the external device 70 of FIG. 1, or by another controller. Alternatively, a manufacturer or a user of the motor module 1000 may select a step size via a mechanical switch. It would also be possible to externally update the values that are stored in the table or the variable step-size memory 40.

In one embodiment, the command position value generation circuit 520 generates a command position value Θ* based on the following equation.

$$\Theta^* = \Theta\text{set} \times N\_STMP \times \text{Dir} + \hat{\Theta} \qquad \text{(equation 1)}$$

Herein, $\hat{\Theta}$ is an estimated position value; Θset is a step size; N_STMP is a number of pulse counts in a pulse signal that is input from the external device 70 within a designated period; and Dir is a symbol defining a rotation direction (direction of displacement) for the rotor. When the direction of displacement is a first direction, Dir=1; when it is a second direction which is opposite to the first direction, Dir=−1.

For instance, an example where a value of 0.45° is being selected as the step size Θset will be described. In this example, let it be assumed that there are 50 pulse counts N_STMP in the pulse signal that is input to the STMP terminal within a current period of T milliseconds from time t0 to time t1, and that the signal which is being supplied to the DIR terminal in the current period indicates Dir=1. Let it also be assumed that the current estimated position value $\hat{\Theta}$ of the rotor R that is acquired from the position estimation device 30 is 112.4°. In this case, according to equation 1 above, the command position value Θ* has the following value.

$$0.45° \times 50 \times 1 + 112.4° = 134.9°$$

In this example, the command position value generation circuit 520 outputs a digital signal indicating a command position value of 134.9°.

FIG. 9 is referred to again.

The command position value that is output from the command position value generation circuit 520 is supplied to the comparator 550*a*. The comparator 550*a* compares the estimated position value that is acquired from the position estimation device 30 against the command position value that is acquired from the command position value generation circuit 520, and outputs a deviation between the estimated position value and the command position value. Based on the value of the comparator 550*a*, the command speed value generation circuit 560 generates a command speed value. The command speed value that is output from the command speed value generation circuit 560 is supplied to the comparator 550*b*. The comparator 550*b* compares the estimated speed value that is acquired from the estimated speed value generation circuit 545 against the command speed value, and outputs a deviation.

Based on these comparison results, the motor control circuit 20 determines a command voltage value, and outputs a PWM signal indicating the command voltage value from the PWM signal generation circuit 570. Determination of the command voltage value may be made through a calculation using a known vector control technique, for example.

Although electric current control is omitted in FIG. 9, electric current control may be performed after speed control. A combination of position control and speed control is not a requirement. Herein, the motor control circuit 20 may generate a command position value and a command speed value based on the variable step-size information and the pulse signal.

Figure 11:
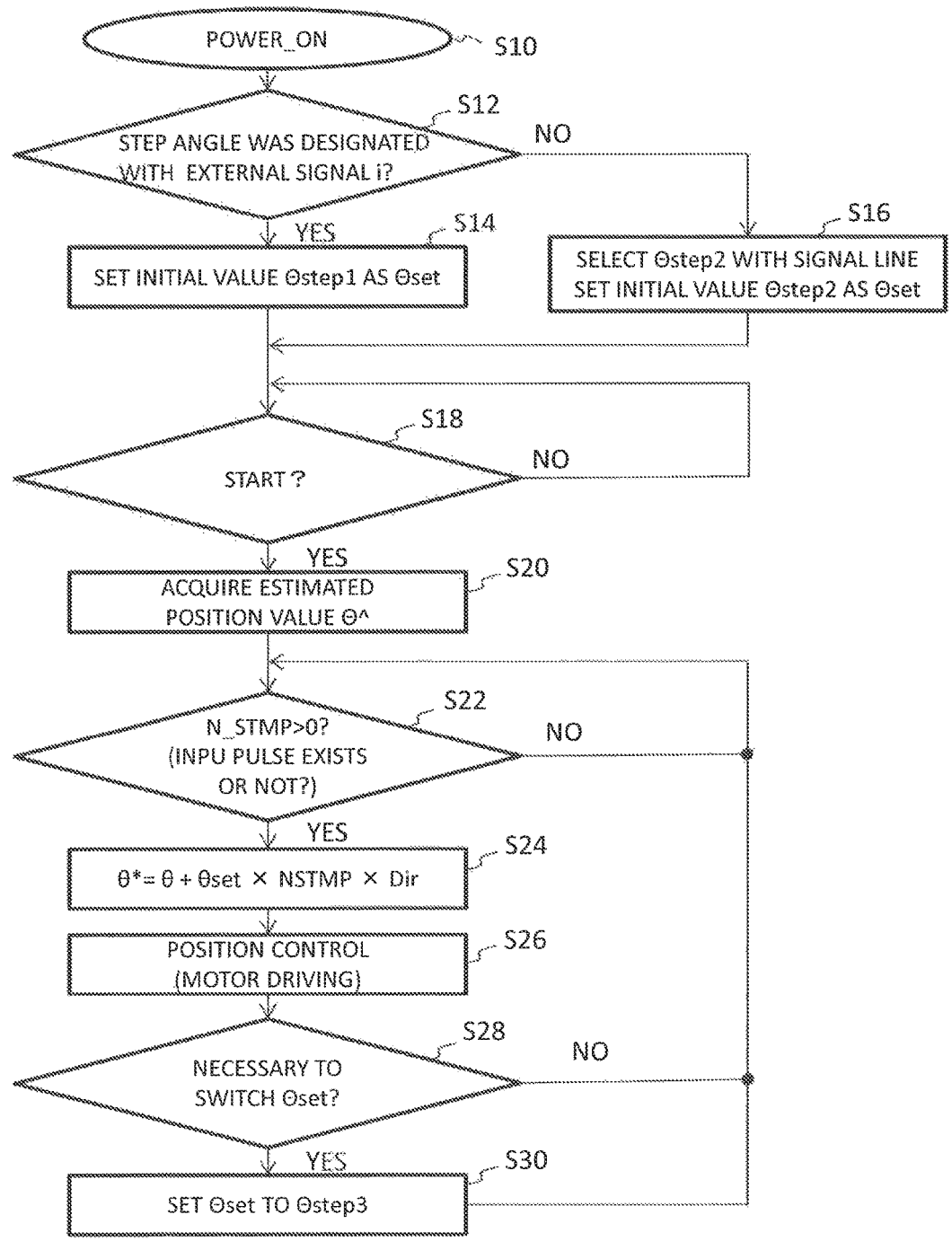
FIG. 11 is a flowchart showing an exemplary operation of command position value generation by the command position value generation circuit 520.

Next, with reference to FIG. 11, an exemplary flow for an operation of command position value generation by the command position value generation circuit 520 will be described.

First, the motor module is booted at step S10. At step S12, presence or absence of an external input signal designating a step angle as a step size is determined. In the example of FIG. 10, a signal on an ST-SIZE terminal is read as an external input signal. When an external input signal is detected, control proceeds to step S14. At step S14, a value Θstep1 that is specified by the external input signal is selected as the step angle Θset. This value is one value among the plurality of candidate values that are stored in the table of FIG. 10, for example.

At step S12, when no external input signal is detected, control proceeds to step S16. At step S16, a value Θstep2 that is specified by another signal line is selected as the step angle Θset. The potential of this signal line is controlled by turning ON or OFF the switches that are included in the motor module 1000, for example, and specifies one of the plurality of candidate values that are stored in the table.

At step S18, it is determined whether or not an operation mode of the motor M is to be begun. If the operation mode is not to be begun, standby is entered. When beginning the operation mode, control proceeds to step S20. At step S20, a current estimated position value $\hat{\Theta}$ of the rotor is acquired from the position estimation device 30. Next, at step S22, the number of pulses in the pulse signal that is input from the external device 70 is counted. The value of pulse counts within a predetermined period is designated as N_STMP.

At step S24, a command position value Θ* is determined by using the aforementioned equation 1. Then, at step S26, rotor position control (motor driving) is performed by using this command position value Θ* and the estimated position value. This motor driving may be performed in accordance with a known control technique.

At step S28, it is determined whether or not switching of the step angle Θset is necessary. If it is unnecessary to switch the step angle Θset, control returns to step S22. If the step angle Θset is to be switched, at step S30, a next value Θstep3 is selected as the step angle Θset.

The need to switch the step angle Θset at step S28 may be determined based on the following exemplary criterion, for example.

- As many signal lines as there are number of bits (which is 1 bit or more) are connected to the command position value generation circuit 520 shown in FIG. 10, and a next value is externally input to these signal lines to update the content of the step angle Θset.
- When an estimated position value $\hat{\Theta}$ of the rotor is predesignated, size of the step angle Θset is modified.
- When a predetermined amount of time has elapsed, or a predetermined point in time is reached, size of the step angle Θset is modified.

Note that the above flow is only an example, and the determination and modification of the step size by the step operation control system according to embodiments of the present disclosure are not limited to the above example. According to the present disclosure, in accordance with a program that is internal to the motor control device 100, or with an external instruction, any of a plurality of candidate values may be selectively read from the variable step-size memory 40 during boot or operation.

Hereinafter, with reference to the drawings as necessary, embodiments of the present disclosure will be described in detail. Note however that unnecessarily detailed descriptions may be omitted. For example, detailed descriptions on what is well known in the art or redundant descriptions on what is substantially the same constitution may be omitted. This is to avoid lengthy description, and facilitate the understanding of those skilled in the art. The accompanying drawings and the following description, which are provided by the inventors so that those skilled in the art can sufficiently understand the present disclosure, are not intended to limit the scope of claims.

[Embodiments]

Figure 12:
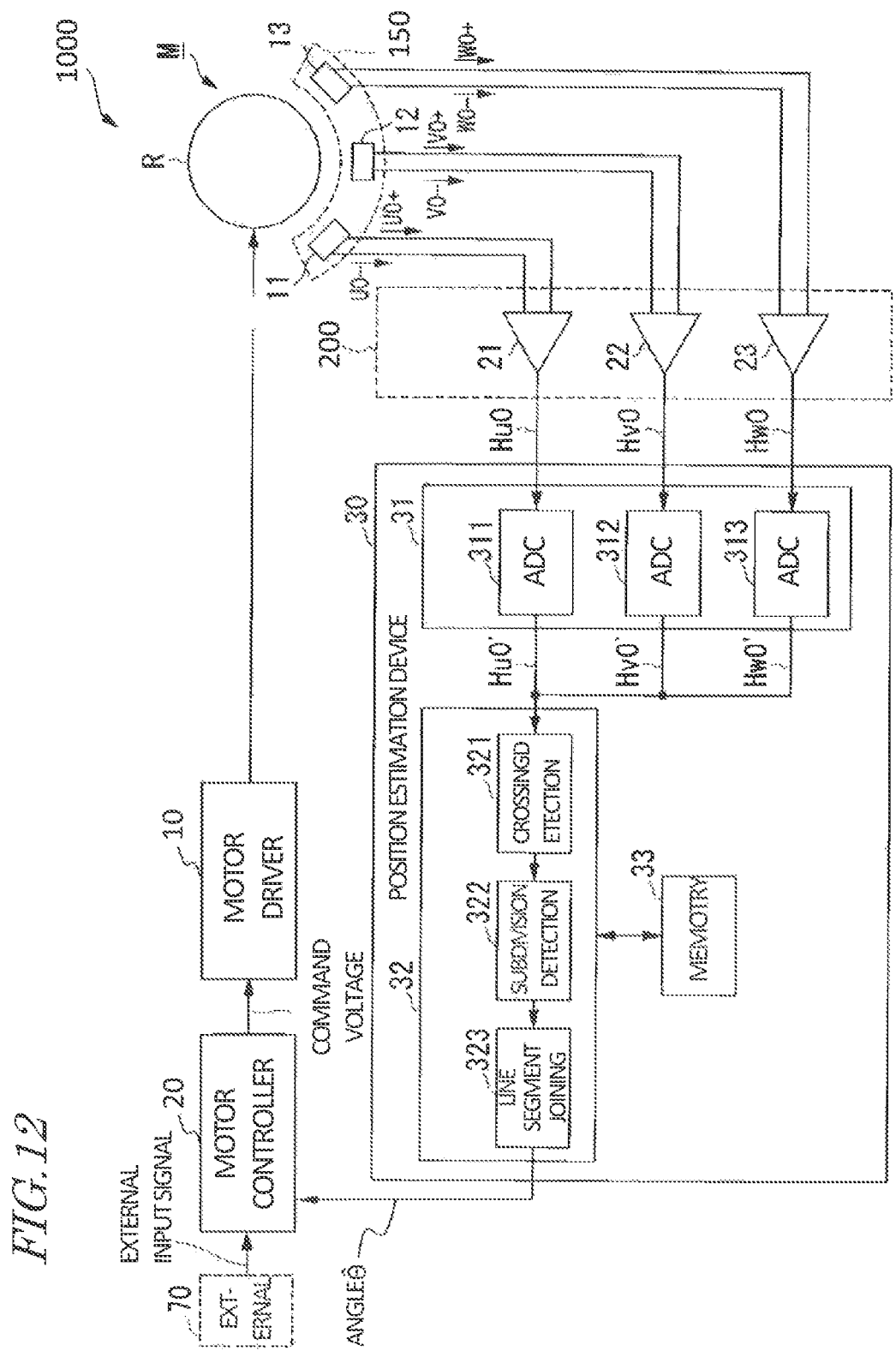
FIG. 12 is a schematic diagram showing an exemplary construction of a motor module 1000 according to an embodiment of the present disclosure.

FIG. 12 is a schematic diagram showing an exemplary construction of a motor module 1000 according to an embodiment of the present disclosure.

As shown in FIG. 12, the motor module 1000 of the present embodiment includes a motor M, a detection device 150, an amplification circuit 200, a position estimation device 30, a motor control device (control circuit) 20, and a motor driving circuit (driving circuit) 10. The motor M in the present embodiment is a brushless DC motor which has a rotor R that rotates around a center axis.

From the external device (controller) 70, external signals, e.g., a pulse signal designating a rotary position of the rotor R, is input to the motor module 1000. In use, the motor module 1000 is attached to a product. The product may be a multifunction product having the functions of a printer, a scanner, a facsimile, etc., or an electric machine such as electric power steering, an antenna tilter, or a fan, for example. When used in a multifunction product, the motor M of the motor module 1000 may be used as mounted in mechanisms (mechanical parts) such as the paper feed section, for example. One multifunction product may include a plurality of motor modules 1000.

The motor M includes a rotor R. The motor M may be a permanent magnet motor, for example. A substrate not shown is attached to the motor M. The substrate has mounted thereof the detection device 150, the amplification circuit 200, the position estimation device 30, the motor control circuit 20, and the motor driving circuit 10.

Although a case where the motor M includes a rotor R will be described as an example, the construction according to the present embodiment is not limited thereto. The motor M may be a linear motor. In the case where the motor M is a linear motor, the motor M includes a mover (or movable element) that undergoes a linear motion, instead of a rotor R. In the present application, the term "mover" encompasses not only a rotor, but also a part that undergoes a linear motion in a linear motor. In the case of a linear motor, CW means a first direction on a straight line, whereas CCW means a second direction which is opposite to the first direction on the same straight line.

The detection device 150 includes sensors 11 to 13. Each of the sensors 11 to 13 is a non-contact magnetic sensor which converts a magnetic field generated in the motor M into electrical signals for output. Each of the sensors 11 to 13 may be a Hall generator, for example. To the amplification circuit 200, the detection device 150 outputs the differential sensor signals which have been detected. The operation of the motor module 1000 according to the present embodiment includes a signal detection step. In the signal detection step, each of N (where N is an integer of 3 or more) detection devices detects a magnetic field which is in accordance with the position of the rotor, and outputs a detection signal as an electrical signal. These detection signals are displaced in phase by an angle obtained by dividing 360 degrees by N. When there is a number N (where N is an integer of 3 or more) of such sensors, magnetic fields that are created by a plurality of magnetic poles are detected, and detection signals each having a magnitude which is in accordance with the intensity of a detected magnetic field are output. The N sensors are disposed so that the N detection signals are displaced in phase by an angle of 360 degrees/N. The detection signals being displaced in phase by an angle of 360 degrees/N encompasses these being displaced in phase by an electrical angle which is 360 degrees×integer±360 degrees/N. The detection signals being displaced in phase by an angle of e.g. 120 degrees (=360 degrees/3) encompasses three detection signals being displaced in phase by an electrical angle of 240 degrees (=360 degrees−120 degrees).

The amplification circuit 200 includes differential amplifiers 21 to 23. Based on differential sensor signals which are input from the detection device 150, the amplification circuit 200 generates a detection signal Hu0, a detection signal Hv0, and a detection signal Hw0. The amplification circuit 200 outputs the generated detection signal Hu0, detection signal Hv0, and detection signal Hw0 to the position estimation device 30. Note that the detection signal Hu0, detection signal Hv0, and detection signal Hw0 are analog signals.

Based on the detection signal Hu0, detection signal Hv0, and detection signal Hw0 which have been input from the amplification circuit 200, the position estimation device 30 estimates a rotary position of the rotor R. Based on the estimated rotary position (mechanical angle), the position estimation device 30 generates an estimated position value $\hat{\Theta}$, and supplies the generated estimated position value $\hat{\Theta}$ to the motor control circuit 20.

The motor control circuit 20 receives the estimated position value $\hat{\Theta}$ being input from the position estimation device 30, and the pulse signal being input from the external device 70. As has been described above, the motor control circuit 20 generates a command voltage for driving the motor M, and outputs the generated command voltage to the motor driving circuit 10.

Based on the command voltage having been input from the motor control circuit 20, the motor driving circuit 10 generates a driving signal, and drives the motor M with the generated driving signal. A typical example of the motor driving circuit 10 is an inverter circuit. An inverter circuit may include: a PWM circuit which outputs a pulse width modulation (PWM) signal in response to a command voltage; a predriver circuit which outputs a gate driving signal based on the PWM signal; and an inverter output circuit which performs switching in response to the gate driving signal.

The motor control circuit 20 and a part of the motor driving circuit 10 (e.g., a PWM circuit) may be implemented as a single integrated circuit package. Such an integrated circuit package would be available as a general-purpose motor control microcomputer. An inverter output circuit in the driving circuit 10 may also be called a power module. Such an inverter output circuit is able to apply a voltage of a magnitude which is in accordance with the command voltage to each coil of the motor M, thus driving the motor M.

Thus, the motor module 1000 receives a pulse signal from the external device 70, and generates a command position value $\Theta^*$. Then, it performs motor control through feedback of a deviation between the command position value $\Theta^*$ and the estimated position value $\hat{\Theta}$.

In the present embodiment, an estimated position signal indicating the estimated position value $\hat{\Theta}$ has a magnitude which linearly changes in accordance with the position (angle) of the rotor R. More specifically, when the rotor R makes one turn, the magnitude of the estimated position signal changes in a continuous straight line, rather than discretely. An example of generating such an estimated position signal will be described in detail below.

Figure 16:
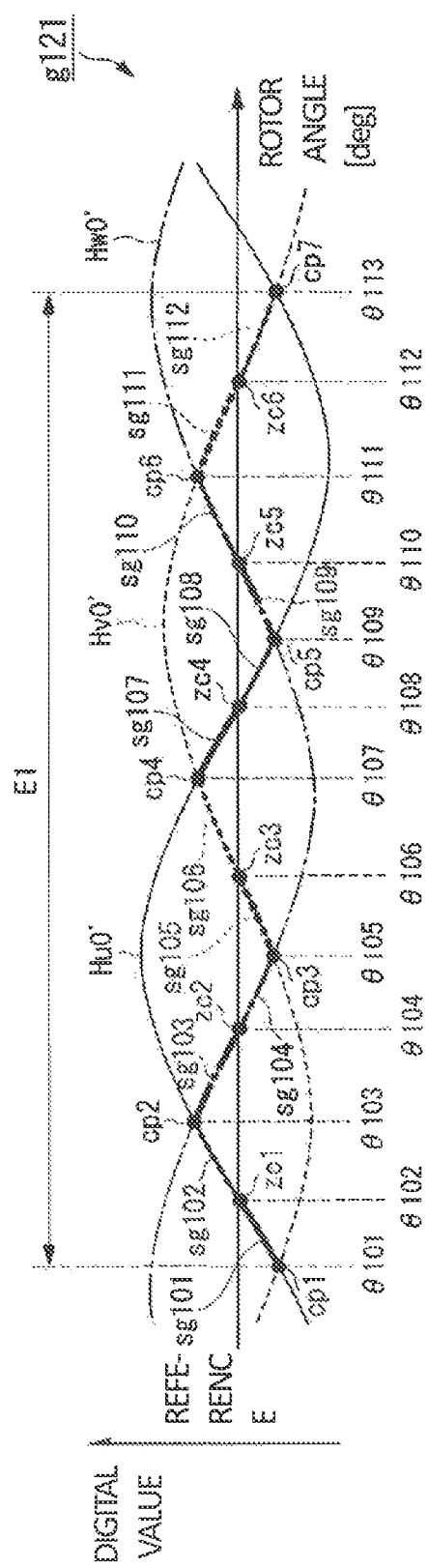
FIG. 16 is a diagram describing relative magnitudes, crossings, zero-crossings, and subdivision signal associated with three detection signals Hu0', Hv0' and Hw0' according to an embodiment.

The motor module 1000 of the present embodiment sequentially detect crossings at which the detection signals Hu0, Hv0 and Hw0 cross each other, and detects, as a subdivision signal, a portion (subdivided line segment) of the detection signal Hu0, Hv0 or Hw0 from a detected crossing to another crossing which is adjacent to that crossing (see FIG. 16).

Among the three detection signals Hu0, Hv0 and Hw0, which are displaced in phase by 120 degrees, any portion that connects or links from a crossing to another crossing which is adjacent to that crossing is a portion of one signal Hu0, Hv0 or Hw0 that has an intermediate level among the detection signals Hu0, Hv0 and Hw0. As shown in FIG. 16, a portion that connects from a crossing to another crossing which is adjacent to that crossing crosses a reference level. Stated otherwise, a portion that connects from a crossing to another crossing which is adjacent to that crossing has a portion that is larger than the reference value and a portion that is smaller than the reference value. As will be described later, a portion that connects from a crossing to another crossing which is adjacent to that crossing may be processed as a single "subdivision signal", or processed as two "subdivision signals". In the latter case, a portion that connects from a crossing to another crossing which is adjacent to that crossing is divided into two portions by a point of zero-crossing with the reference value. A portion that connects from a crossing to another crossing which is adjacent to that crossing may be divided into three or more "subdivision signals".

Figure 17:
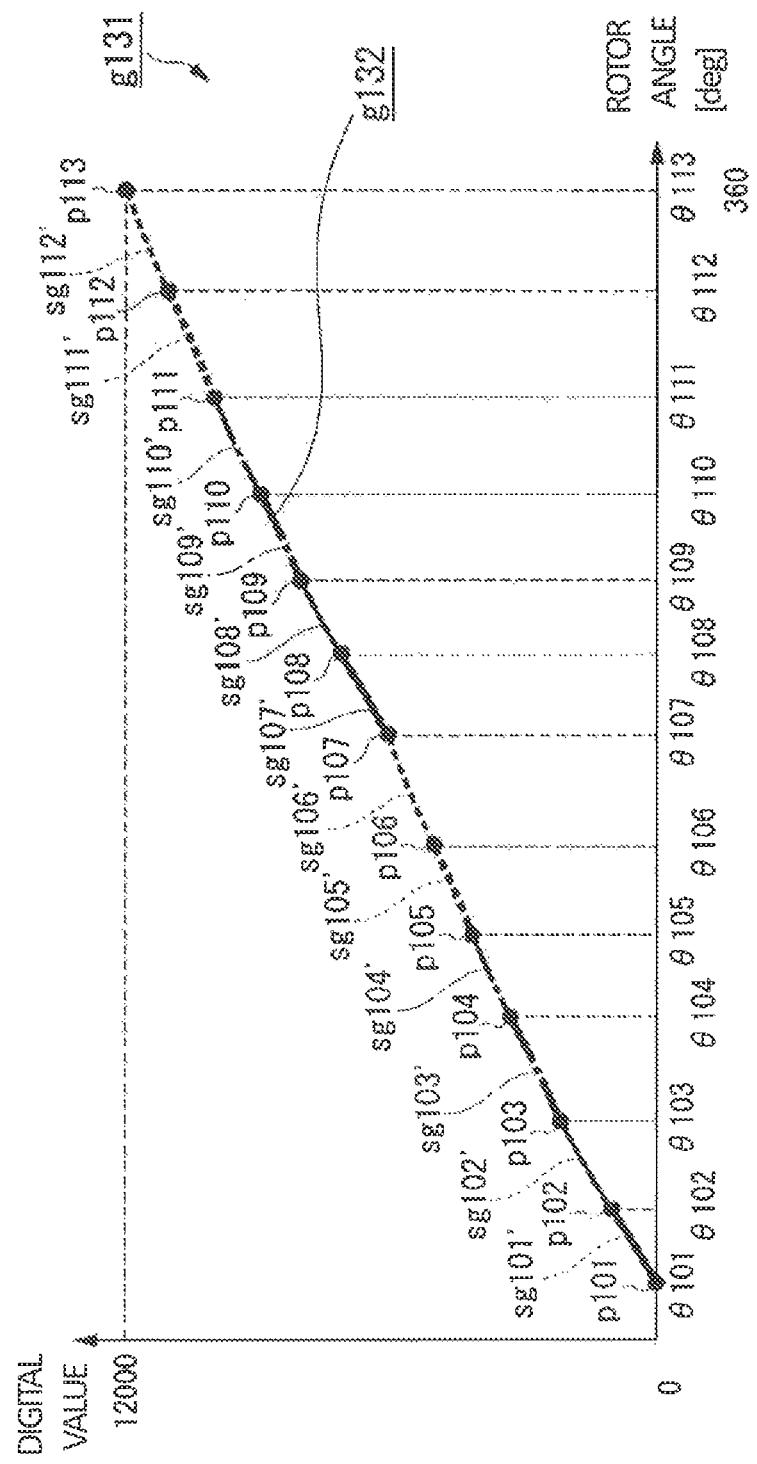
FIG. 17 is a diagram describing joining of subdivision signals which are worth one cycle of electrical angle according to an embodiment.
Figure 18:
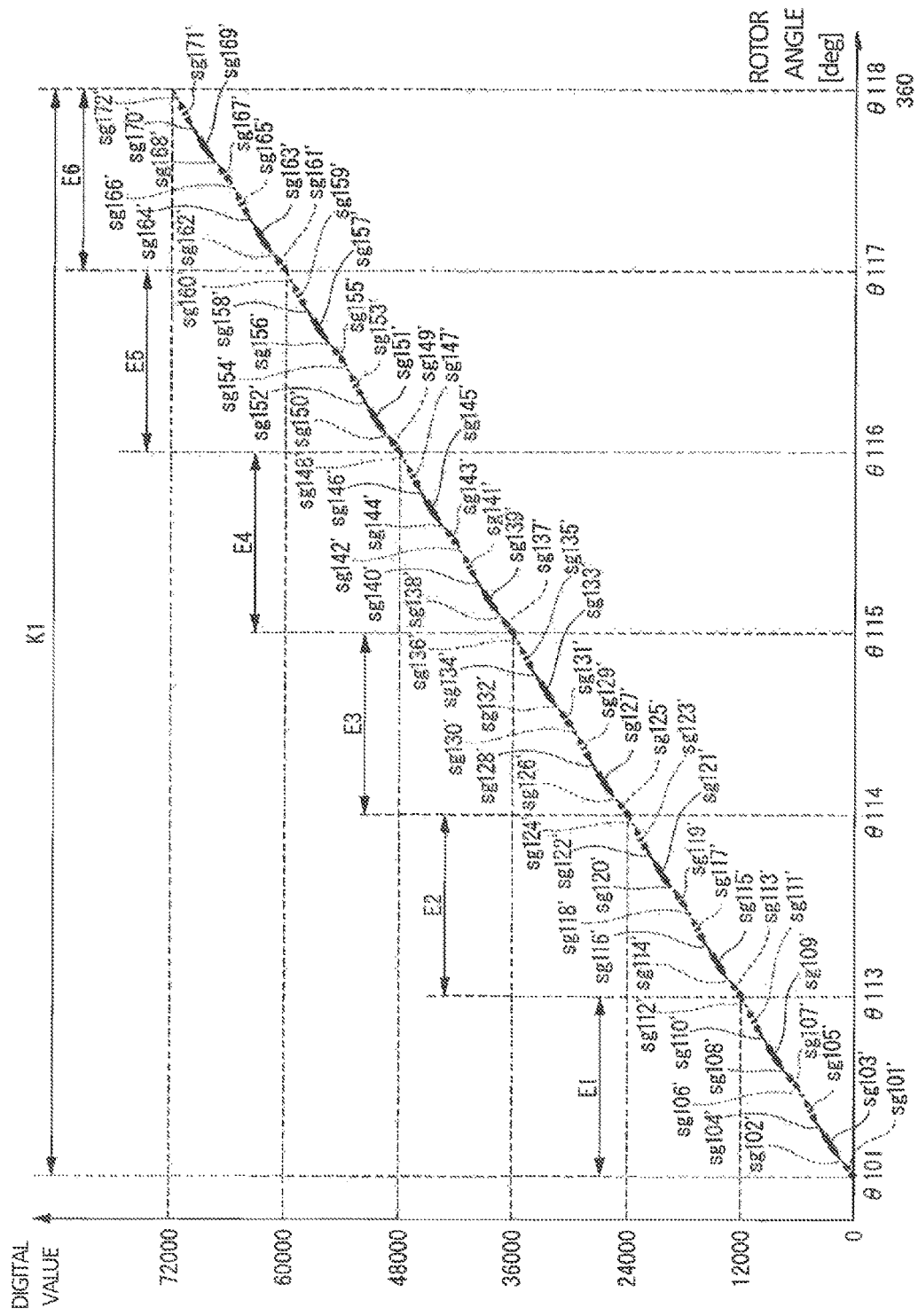
FIG. 18 is a diagram showing a specific example of joining subdivision signals which are worth one cycle of mechanical angle, in an operation by the line segment joining section 323.

In accordance with the direction in which the rotor is moving, the motor module 1000 sequentially joins the detected subdivision signals, and estimates a position of the rotor based on the plural subdivision signals having been joined, thus generating an estimated position value signal (see FIG. 17, FIG. 18). Note that the estimated position value can be used as a feedback value by a system of electric current control, a system of speed control, a system of position control, or any system of control which is a combination thereof.

Next, a schematic construction of the motor M according to the present embodiment will be described.

Figure 13:
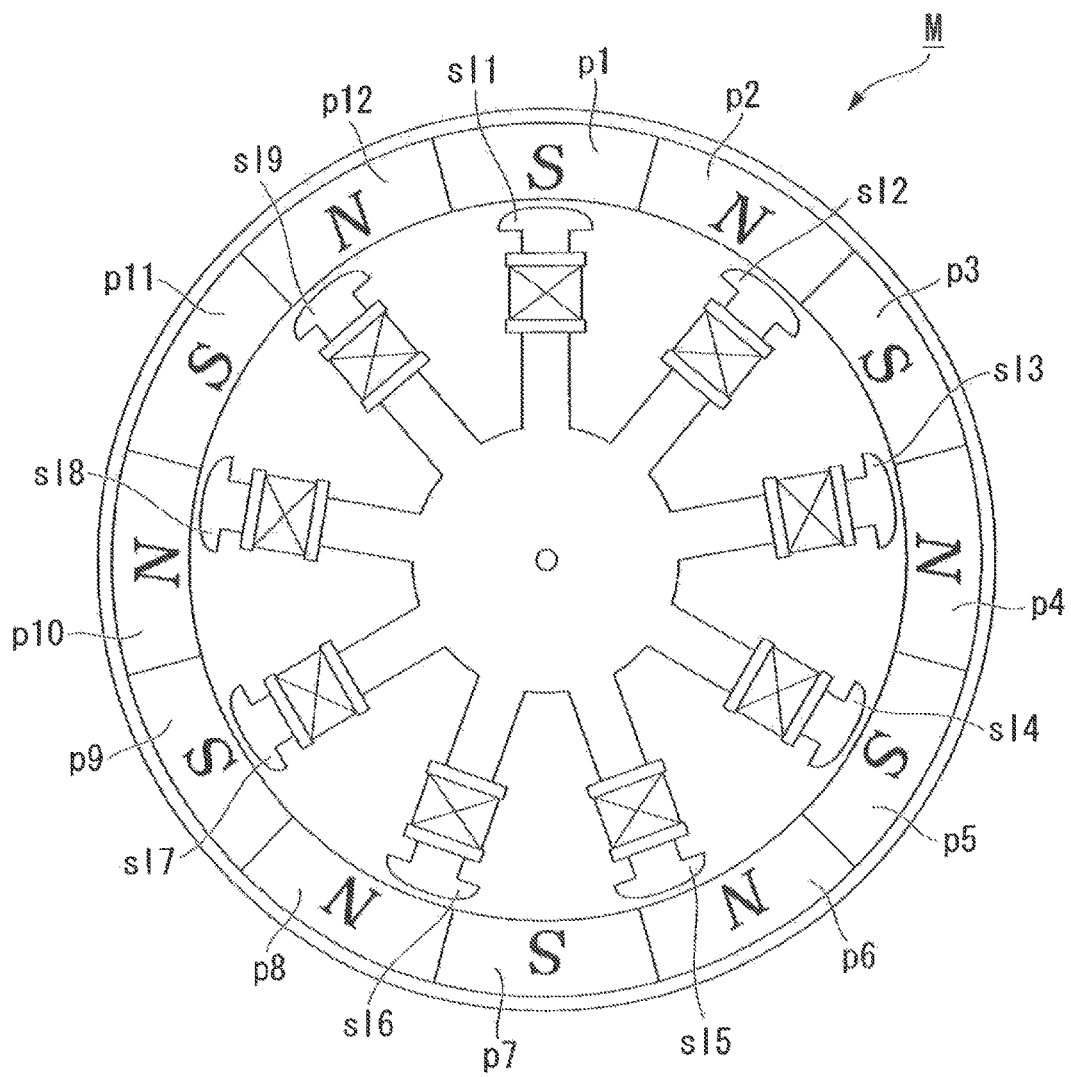
FIG. 13 is a diagram showing the schematic construction of a motor M according to an embodiment.

FIG. 13 is a diagram showing the schematic construction of the motor M according to the present embodiment. In the example shown in FIG. 13, the motor M is a permanent magnet motor. Magnetic poles p1 to p12 are the magnetic poles of the permanent magnet motor. The number of poles, which is indicative of the number of magnetic poles in the motor M, is 12 in the example shown in FIG. 13. The number of pole pairs, which is indicative of the number of pairs consisting of an N pole and an S pole, is 6 in the example shown in FIG. 13. Slots s11 to s19 are armatures (stators) around each of which a coil is wound. The number of slots in the permanent magnet motor according to the present embodiment is 9. The magnetic poles p1 to p12 may be portions of the rotor R (see FIG. 12). The motor M in FIG. 13 represents a motor of an outer rotor type.

Next, the operation of the sensors 11 to 13 will be described.

Each of the sensors 11 to 13 detects a magnetic field that is based on an adjoining pair of an N pole and an S pole, and outputs a signal which is worth one cycle. This corresponds to one cycle of electrical angle. In the form of differential sensor signals, each of the sensors 11 to 13 outputs the detected electrical signal, which is worth one cycle of electrical angle, to the amplification circuit 200. These differential sensor signals, which are worth one cycle, correspond to one cycle of electrical angle.

Now, the sensors 11 to 13 respectively detect electrical signals which are displaced in phase by 120 degrees of electrical angle, and output them to the corresponding differential amplifiers 21 to 23. In other words, there are three sensors included in the detection device 150, such that the three detection signals are displaced in phase by 120 degrees. In one specific example, the sensors 11 to 13 detect electrical signals which are displaced in phase by 40 degrees of mechanical angle (240 degrees of electrical angle).

In the present embodiment, an electrical signal which is detected by the sensor 11 is designated as U-phase. An electrical signal which is detected by the sensor 12 is designated as V-phase. An electrical signal which is detected by the sensor 13 is designated as W-phase. The differential sensor signals which are output from the sensor 11 are differential sensor signals U0+ and U0− are inverse of each other. The differential sensor signals which are output from the sensor 12 are differential sensor signals V0+ and V0− are inverse of each other. The differential sensor signals which are output from the sensor 13 are detection signals W0+ and W0− are inverse of each other.

Next, the detection signals to be output from the amplification circuit 200 will be described with reference to FIG. 12.

The differential amplifier 21 amplifies a voltage difference between the U-phase detection signals U0− and U0+ which are input from the sensor 11, and outputs an amplified detection signal Hu0 to the position estimation device 30.

The differential amplifier 22 amplifies a voltage difference between the V-phase detection signals V0− and V0+ which are input from the sensor 12, and outputs an amplified detection signal Hv0 to the position estimation device 30.

The differential amplifier 23 amplifies a voltage difference between the W-phase detection signals W0− and W0+ which are input from the sensor 13, and outputs an amplified detection signal Hw0 to the position estimation device 30.

Figure 14:
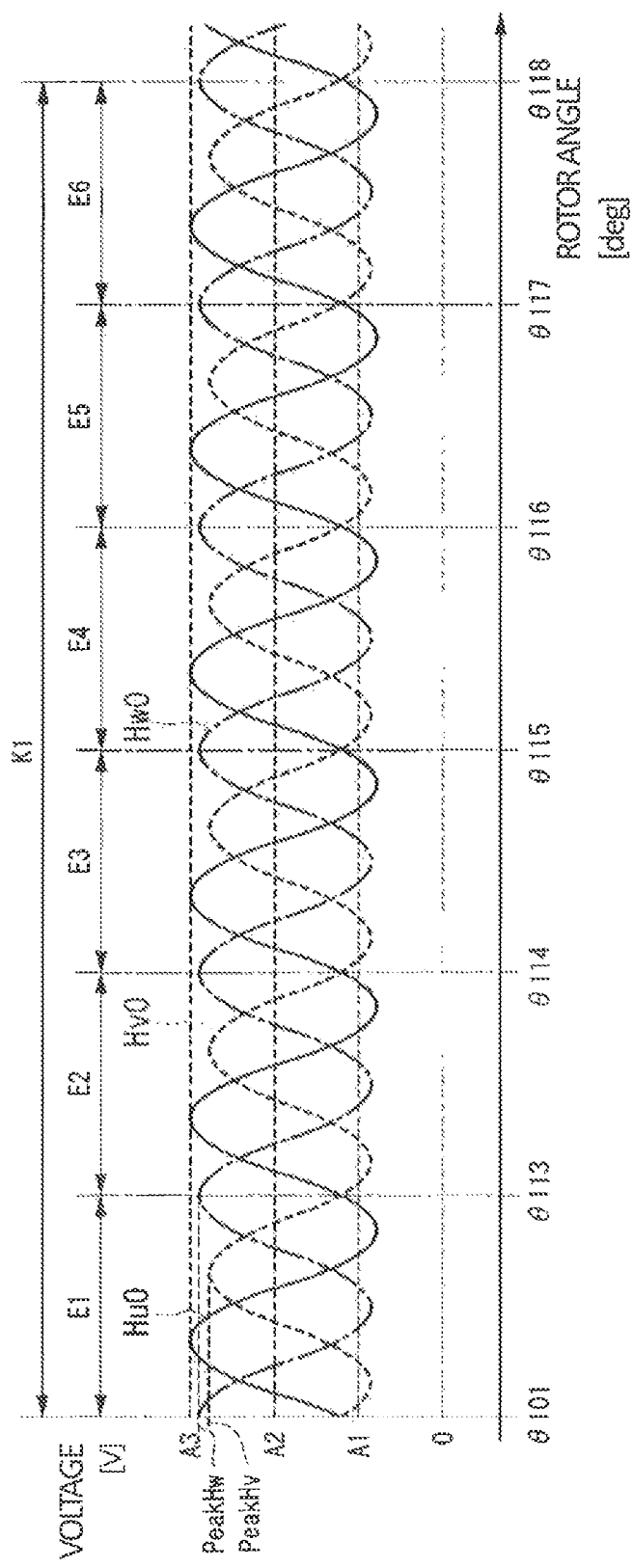
FIG. 14 is a diagram showing examples of detection signals Hu0, Hv0 and Hw0 which are output from an amplification circuit 200 according to an embodiment.

Next, examples of detection signals Hu0, Hv0 and Hw0 which are output from the amplification circuit 200 will be described. FIG. 14 is a diagram showing examples of detection signals Hu0, Hv0 and Hw0 which are output from the amplification circuit 200 according to the present embodiment. In FIG. 14, the horizontal axis represents the rotor angle [deg]. The vertical axis represents the signal magnitude.

In the example shown in FIG. 14, a period E1 from rotor angles θ101 through θ113 represents one cycle of electrical angle. A period E2 from rotor angles θ113 through θ114, a period E3 from rotor angles θ114 through θ115, a period E4 from rotor angles θ115 through θ116, a period E5 from rotor angle θ116 through θ117, and a period E6 from rotor angles θ117 through θ118 each represent one cycle of electrical angle. A period K1 which spans periods E1 through E6 represents one cycle of mechanical angle. In other words, a period which is equivalent to one cycle of electrical angle is a period determined by dividing a period which is equivalent to one cycle of mechanical angle by the number of pole pairs.

In the example shown in FIG. 14, the detection signal Hu0 takes local maximums A3 [V]. The detection signal Hw0 takes local maximums PeakHw [V], which are smaller than the voltage value of A3. The detection signal Hv0 takes local maximums PeakHv [V], which are smaller than the voltage value of PeakHw. Thus, owing to errors when mounting the sensors 11 to 13, and the differing sensitivity from sensor to sensor, there are amplitude variations among the detection signals Hu0, Hv0 and Hw0. Moreover, the signals Hu0, Hv0 and Hw0 have respectively different central voltage values. In other words, the signals Hu0, Hv0 and Hw0 each have an offset component.

Next, a detailed construction of the position estimation device 30 will be described with reference to FIG. 12.

The position estimation device 30 includes an AD converter 31, a position calculating section 32, and a storage device 33. The AD converter 31 converts the detection signals having been input from the amplification circuit 200, which are analog signals, into detection signals that are digital signals, and outputs the digital detection signals resulting from conversion to the position calculating section 32. More specifically, it includes an AD conversion circuit 311, an AD conversion circuit 312, and an AD conversion circuit 313. The AD conversion circuit 311 converts the detection signal Hu0, which is an analog signal, into a detection signal Hu0', which is a digital signal, for output to the position calculating section 32. The AD conversion circuit 312 converts the detection signal Hv0, which is an analog signal, into a detection signal Hv0', which is a digital signal, for output to the position calculating section 32. The AD conversion circuit 313 converts the detection signal Hw0, which is an analog signal, into a detection signal Hw0', which is a digital signal, for output to the position calculating section 32. The storage device 33 stores information to be utilized in online processing. Online processing is a process to be performed in real time while the rotor R is rotating. The information to be stored in the storage device 33 will be described later.

As described above, the conversion of a detection signal into a signal which is suitable for processing in the position calculating section 32 may be called "preprocessing". The AD converter 31 is an example of a circuit that performs preprocessing. The position calculating section 32 may also include circuits that perform any other preprocessing.

For the detection signals Hu0', Hv0' and Hw0', which are digital signals resulting from conversion by the AD converter 31, the horizontal axis represents the rotor angle [deg]; and the vertical axis represents the magnitude of the digital value. The position calculating section 32 includes a crossing detection device 321, a subdivision detection device 322, and a line segment joining section 323. The crossing detection device 321 detects a crossing between detection signals, and also a zero-crossing between a detection signal and a reference value. In other words, between a crossing and another crossing which is adjacent to that crossing, the crossing detection device 321 sequentially detects each zero-crossing at which the potential of the detection signal crosses the reference voltage. The reference value is a value corresponding to a digital value of 0. The crossing detection device 321 outputs information representing the coordinates of detected crossings and information representing the coordinates of zero-crossings to the subdivision detection device 322. As used herein, the information representing the coordinates of crossings and zero-crossings is information that is expressed in terms of rotor angles and magnitudes of digital values. The subdivision detection device 322 detects any detection signal between the crossing and the zero-crossing as a subdivision signal. In the detection, the information representing the coordinates of a crossing and the information representing the coordinates of a zero-crossing which are input from the crossing detection device 321 is used. The subdivision detection device 322 outputs information representing the detected subdivision signals to the line segment joining section 323. By using the information representing the subdivision signals which is input from the subdivision detection device 322, the line segment joining section 323 sequentially joins the subdivision signals. Herein, the information representing a subdivision signal is information which is expressed by the rotor angle and the magnitude of the digital value, from the start position to the end position of the subdivision signal constituting a part of the detection signal.

As described above, the operation by the motor module 1000 according to the present embodiment includes a crossing detection step, a subdivision detection step, and a line segment joining step. In the crossing detection step, the crossing detection device 321 sequentially detects a crossing at which each detection signal having been output through the signal detection step crosses another. In the subdivision detection step, the subdivision detection device 322 detects a portion of the detection signal that connects from the crossing to another crossing which is adjacent to that crossing, as one or more subdivision signals. In the line segment joining step, the line segment joining section 323 sequentially joins the subdivision signals and estimates the position of the rotor based on the plural subdivision signals having been joined, to generate an estimated position signal.

Next, after describing a flow of processes that are performed by the position estimation device 30 in outline, the flow of processes that are performed by the position estimation device 30 will be described in detail. The position estimation section 30 performs the following processes through online processing.

(step S101) The crossing detection device 321 acquires the detection signals Hu0', Hv0' and Hw0' having been input from the AD converter 31.

(step S102) By using the values respectively exhibited by the detection signals Hu0', Hv0' and Hw0' acquired at step S101, the crossing detection device 321 sequentially detects crossings and zero-crossings. Next, the crossing detection device 321 consecutively outputs information representing the coordinates of the detected crossings and zero-crossings, and the input detection signals Hu0', Hv0' and Hw0', to the subdivision detection device 322.

(step S103) The subdivision detection device 322 detects a portion of a detection signal from a crossing to a zero-crossing which is adjacent to that crossing, i.e., a partial detection signal from a crossing to a zero-crossing which is adjacent to that crossing, as a first subdivision signal. Alternatively, the subdivision detection device 322 detects a portion of a detection signal from a zero-crossing to a crossing which is adjacent to that zero-crossing, i.e., a partial detection signal from a zero-crossing to a crossing which is adjacent to that zero-crossing, as a second subdivision signal.

(step S104) If the rotor R is undergoing CW rotation, the line segment joining section 323 sequentially joins, in the forward direction, the subdivision signals having been input from the subdivision detection device 322 over the course of one cycle of mechanical angle.

(step S105) The position estimation device 30 estimates a mechanical position based on the subdivision signals having been joined by the line segment joining section 323, thus estimating an estimated position value $\hat{\Theta}$.

The position estimation device 30 repeats the processes of steps S101 through S105 for every control cycle. A control cycle may be, for example, any one of the respective control cycles of current (torque), speed, or position control.

Next, details of the flow of processes performed by the position estimation device 30 will be described.

While the rotor R is rotating, the crossing detection device 321 acquires detection signals Hu0', Hv0' and Hw0' which are respectively input from AD conversion circuits 311 to 313. The detection signal Hu0', detection signal Hv0', and detection signal Hw0' which are output from the AD converter 31 will be described with reference to FIG. 15.

Figure 15:
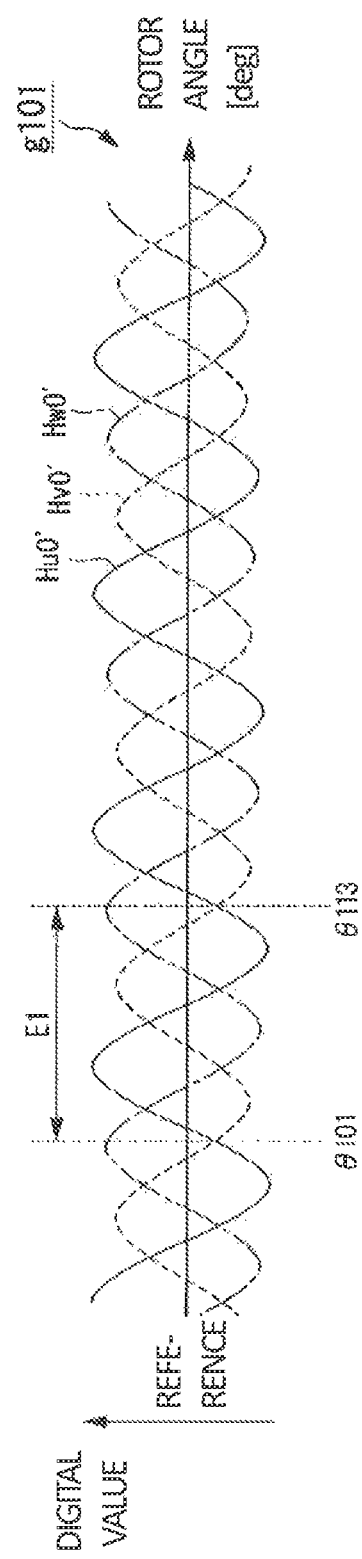
FIG. 15 is a diagram describing examples of detection signals Hu0', Hv0' and Hw0' which are output by the AD converter 31 according to an embodiment.

FIG. 15 is a diagram describing examples of detection signals Hu0', Hv0' and Hw0' which are output by the AD converter 31 according to the present embodiment. In FIG. 15, the horizontal axis represents the rotor angle [deg]. The vertical axis represents the digital value. The waveforms Hu0', Hv0' and Hw0' shown in FIG. 5 are waveform diagrams representing the detection signals having been converted into digital signals by the AD conversion circuits 311 to 313. For example, when the number of bits of the AD converter 31 is 12 bits, the range of digital signal values is +2047 to −2048. In FIG. 15, the period E1 of the rotor angles θ101 through θ113 is equivalent to one cycle of electrical angle.

Next, the process of detecting crossings and zero-crossings which is performed by the crossing detection device 321 at step S102 will be described in detail.

The crossing detection device 321 acquires detection signals Hu0', Hv0' and Hw0' which are output from the AD converter 31. The crossing detection device 321 sequentially detects a crossing between acquired detection signals, this being calculated from the coordinates of two sampled points. Moreover, the crossing detection device 321 sequentially detects a zero-crossing between an acquired detection signal and a reference value. The coordinates of such a crossing or zero-crossing are given by a rotor angle on the horizontal axis and a digital value on the vertical axis. The crossing detection device 321 detects the coordinates of the crossings, and outputs information represent the detected coordinates of the crossings to the subdivision detection device 322. Moreover, the crossing detection device 321 detects the coordinates of the zero-crossings and outputs information representing the detected coordinates of the zero-crossings to the subdivision detection device 322. Moreover, the crossing detection device 321 outputs the acquired detection signals Hu0', Hv0' and Hw0' to the subdivision detection device 322.

Next, the subdivision signal detection process which is performed by the subdivision detection device 322 at step S103 in FIG. 4 will be described in detail.

The subdivision detection device 322 consecutively acquires the information representing the coordinates of the crossings, the information representing the coordinates of the zero-crossings, and the detection signals Hu0', Hv0' and Hw0', which have been input from the crossing detection device 321. Among the acquired detection signals, the subdivision detection device 322 detects any detection signal from a crossing to a zero-crossing which is adjacent to that crossing as a first subdivision signal. Among the acquired detection signals, the subdivision detection device 322 detects any detection signal from a zero-crossing to a crossing which is adjacent to that zero-crossing as a second subdivision signal. The subdivision detection device 322 consecutively outputs the detected subdivision signals to the line segment joining section 323. Herein, the subdivision detection device 322 detects information representing a first subdivision signal. The information representing a first subdivision signal is information of a deviation in digital value and a deviation in rotor angle from a crossing to a zero-crossing which is adjacent to that crossing.

Next, specific examples of crossings, zero-crossings, and subdivision signals will be described one after another.

First, specific examples of crossings and zero-crossings to be detected by the crossing detection device 321 will be described with reference to FIG. 16.

FIG. 16 is a diagram describing relative magnitudes, crossings, zero-crossings, and subdivision signal associated with three detection signals Hu0', Hv0' and Hw0' according to the present embodiment. In FIG. 16, the horizontal axis represents the rotor angle [deg]. The vertical axis represents the digital value. Moreover, FIG. 16 is a diagram showing enlarged the period E1 of the rotor angles θ101 through θ113 in FIG. 15.

In FIG. 16, points cp1 through cp7 each denote a crossing. As used herein, a crossing is a point at which two detection signals cross each other. For example, the crossing cp1 in the rotor angle θ101 is a point at which the detection signal Hu0' and the detection signal Hv0' cross each other.

Moreover, points zc1 through zc6 denote a zero-crossing. As used herein, a zero-crossing is a point at which any of the detection signals Hu0', Hv0' and Hw0' crosses a reference value in digital value. For example, the zero-crossing zc1 in the rotor angle θ102 is a point at which the detection signal Hu0' crosses the reference value.

Next, specific examples of subdivision signals to be detected by the subdivision detection device 322 will be described with reference to FIG. 16. In the following, a segment refers to each single subdivision signal. The period spanning a segment is from a start point to an end point of each subdivision signal. Segments come in 12 periods over the course of one cycle of electrical angle. When the number of pole pairs in the motor M is 6, six cycles of electrical angle corresponds to one cycle of mechanical angle; therefore, segments come in 72 periods over the course of one cycle of mechanical angle. The ordinal number, from 1 to 12, of each subdivision signal over the course of one cycle of electrical angle may be referred to as a section. A subdivision signal is a detection signal from a crossing cp(n) to a zero-crossing zc(m) which is adjacent to that crossing cp(n) in FIG. 16. Alternatively, it is a detection signal from a zero-crossing zc(m) to a crossing cp(n+1) which is adjacent to that zero-crossing zc(m). Note that n is an integer from 1 to 7, and m is an integer from 1 to 6. Specifically, for example, a portion of the detection signal Hu0' from the crossing cp1 to the zero-crossing zc1 is a subdivision signal sg101. A portion of the detection signal Hu0' from the zero-crossing zc1 to the crossing cp2 is a subdivision signal sg102. In FIG. 16, the period from θ101 through θ102, i.e., the period of the subdivision signal sg101, corresponds to the period spanning segment number 1. The respective periods of the subdivision signals sg102 through sg112 correspond to periods spanning segment numbers 2 through 12.

In the example shown in FIG. 16, the detection signals Hu0', Hv0' and Hw0' are sine waves; therefore, the subdivision signals sg101 through sg112 are signals spanning ranges, within the sine waves, that better resemble lines than does any other portion.

Now, the relative magnitudes of the three detection signals Hu0', Hv0' and Hw0' will be described with reference to FIG. 16.

For example, in the period of the rotor angles θ101 through θ103, which is a period spanning Segment 1 and Segment 2, the digital value of the detection signal Hw0' is the largest among the three detection signals. It is the detection signal Hu0' that has the next largest digital value to the detection signal Hw0'. The detection signal Hv0' has the smallest digital value. Moreover, in the period of the rotor angles θ101 through θ102, which is a period spanning Segment 1, the digital value of the detection signal Hu0' is smaller than the reference value. In the period of the rotor angles θ102 through θ103, which is a period spanning Segment 2, the digital value of the detection signal Hu0' is larger than the reference value.

Also for Segments 3 through 12, relative magnitudes of the three detection signals Hu0', Hv0' and Hw0' are stored in the storage device 33, with respect to each segment.

Thus, over the course of one cycle of electrical angle, relative magnitudes of the three detection signals Hu0', Hv0' and Hw0' and their relative magnitudes with respect to the reference value in each segment are stored in the storage device 33.

Next, the process of joining subdivision signals which is performed by the line segment joining section 323 at step S104 in FIG. 4 will be described in detail.

The line segment joining section 323 sequentially joins subdivision signals from the subdivision detection device 322. Herein, the line segment joining section 323 joins the subdivision signals in the same positive or negative direction of the digital value, in accordance with the crossings or zero-crossings, the relative magnitudes of the detection signals Hu0', Hv0' and Hw0', and their relative magnitudes with respect to the reference value.

Specifically, for each segment, the line segment joining section 323 extracts a detection signal that ranks in the middle (which is also referred to as an intermediate signal) (e.g., the second largest (smallest) in the example of FIG. 16) in terms of relative magnitudes of the digital values of the detection signals Hu0', Hv0' and Hw0'. The line segment joining section 323 makes a relative-magnitude comparison between each extracted intermediate signal in digital value and the detection signal at an immediately previous crossing or zero-crossing in digital value (which is also referred to as a crosspoint signal value). Herein, an immediately previous crossing or zero-crossing is supposed to be immediately previous to an intermediate signal in the rotor angle direction, as the crossing cp1 is to the subdivision signal sg101, or as the zero-crossing zc1 is to the subdivision signal sg102, in the example of e.g. FIG. 16.

The subdivision signal sg102 will be discussed. If the digital value of the intermediate signal sg102 is determined as equal to or greater than the immediately previous crosspoint signal value zc1, then the line segment joining section 323 adds a value which is obtained by subtracting the immediately previous crosspoint signal value zc1 from the digital value of the intermediate signal sg102 to the immediately previous crosspoint signal value zc1. On the other hand, if the digital value of the intermediate signal sg102 is determined as smaller than the immediately previous crosspoint signal value zc1, then the line segment joining section 323 adds a value which is obtained by subtracting the digital value of the intermediate signal sg102 from the immediately previous crosspoint signal value zc1. The line segment joining section 323 repeats this addition in ascending order from the smaller rotor angles. As a result, the line segment joining section 323 is able to join subdivision signals in the positive direction of digital values (see FIG. 17).

Note that, the line segment joining section 323 may add a difference, i.e., an absolute value, between the digital value of an intermediate signal and the immediately previous crosspoint signal value.

Since the motor M includes 6 pole pairs, the end point of the subdivision signal sg112' corresponds to a mechanical angle of 60 [degM]. The end point of the subdivision signal sg124' corresponds to a mechanical angle of 120 [degM]. The end point of the subdivision signal sg136' corresponds to a mechanical angle of 180 [degM]. The end point of the subdivision signal sg148' corresponds to a mechanical angle of 240 [degM]. The end point of the subdivision signal sg160' corresponds to a mechanical angle of 300 [degM]. The end point of the subdivision signal sg172' corresponds to a mechanical angle of 360 [degM].

A specific example of joining subdivision signals which are worth one cycle of electrical angle, as performed by the line segment joining section 323, will be described.

FIG. 17 is a diagram describing joining of subdivision signals which are worth one cycle of electrical angle according to the present embodiment. FIG. 17 presents a diagram where subdivision signals sg101' through sg112' pertaining to the period E1 in FIG. 16 are joined. In FIG. 17, the horizontal axis represents the rotor angle [degE]. The vertical axis represents the digital value. In the example shown in FIG. 17, the rotor R is undergoing CW rotation. In FIG. 17, the subdivision signals sg101' through sg112' are signals resulting from the subdivision signals sg101 through sg112 being joined together by the line segment joining section 323 in FIG. 16. Points p101 through p113 are points replacing the crossings cp1 through cp7 and zero-crossings zc1 through zc6 in FIG. 16. The curve g132 is a curve obtained by joining together the subdivision signals sg101' through sg112'.

In the following, the forward direction is a direction in which the digital value increases with increase in the rotor angle. The line segment joining section 323 replaces the crossing cp1 with the point p101, for example. The line segment joining section 323 joins the subdivision signal sg101' in the forward direction. Specifically, the line segment joining section 323 replaces the subdivision signal sg101 in FIG. 16 with the subdivision signal sg101', whose start point is the point p101 and end point is the point p102. Moreover, the line segment joining section 323 replaces the zero-crossing zc1 with the point p102.

Moreover, the line segment joining section 323 joins the subdivision signal sg102' in the forward direction. Specifically, the subdivision signal sg101 in FIG. 16 is replaced with the subdivision signal sg102', whose start point is the point p102 and end point is the point p103. Moreover, the line segment joining section 323 replaces the crossing cp2 with the point p103.

As indicated by the curve g132 in FIG. 17, the line segment joining section 323 joins the subdivision signals sg101' through sg112' shown in FIG. 16, sequentially in the forward direction. As a result, the crossing cp1 at the rotor angle θ101 is replaced with a digital value of 0. Moreover, the line segment joining section 323 replaces the crossing cp7 in the rotor angle θ113 with a digital value of 1200. In FIG. 17, a digital value of 12000 corresponds to 360 [degE] constituting one cycle of electrical angle.

A specific example of joining of subdivision signals over the course of one cycle of mechanical angle, through operation of the line segment joining section 323, will be described with reference to FIG. 18.

In the first cycle E1, the line segment joining section 323 sequentially joins the subdivision signals sg101 through sg112 in FIG. 16 in the forward direction, over the course of one cycle of electrical angle. As a result, as indicated by the subdivision signals sg101' through sg112' in FIG. 17, the subdivision signals sg101 through sg112 in FIG. 16 become joined.

Next, at the second cycle E2, to the end point of the subdivision signal sg112', the line segment joining section 323 joins the start point of the subdivision signal sg113' of the second cycle E2. Then, the line segment joining section 323 joins the subdivision signals sg113 through sg124 which are worth one cycle of electrical angle in the forward direction. As a result, as indicated by the subdivision signals sg113' through sg124' in FIG. 18, the subdivision signals sg113 through sg124 become joined.

Thereafter, to the end point of the subdivision signal sg124' of the second cycle E2, the line segment joining section 323 joins the start point of the subdivision signal sg125' of the third cycle E3. Next, to the end point of the subdivision signal sg136' of the third cycle E3, the line segment joining section 323 joins the start point of the subdivision signal sg137' of the fourth cycle E4. Next, to the end point of the subdivision signal sg148' of the fourth cycle E4, the line segment joining section 323 joins the start point of the subdivision signal sg149' of the fifth cycle E5. Next, to the end point of the subdivision signal sg160' of the fifth cycle E5, the line segment joining section 323 joins the start point of the subdivision signal sg161' of the sixth cycle E6.

FIG. 18 is a diagram showing an example result of joining subdivision signals which are worth one cycle of mechanical angle, according to the present embodiment. As shown in FIG. 18, Each cycle of electrical angle contains 12 subdivision signals. The first cycle E1 contains the subdivision signals sg101' through sg112'. The second cycle E2 contains the subdivision signals sg113' through sg124'. The third cycle E3 contains the subdivision signals sg125' through sg136'. The fourth cycle E4 contains the subdivision signals sg137' through sg148'. The fifth cycle E5 contains the subdivision signals sg149' through sg160'. The sixth cycle E6 contains the subdivision signals sg161' through sg172'.

Therefore, the cycle K1, which is equivalent to one cycle of mechanical angle, contains 72 subdivision signals sg101' through sg172'.

Next, the process of mechanical angle generation which is performed by the position estimation device 30 at step S105 in FIG. 4 will be described. Herein, the mechanical angle at a given point on sg102' will be described. The mechanical angle positions of sg102' are within the period E1 in FIG. 18, an enlarged diagram of this period E1 being given in FIG. 17. The line segment joining section 323 adds a value which is obtained by subtracting an immediately previous crosspoint signal value zc1 from the digital value of an intermediate signal, to the immediately previous crosspoint signal value zc1. Moreover, as described above, the line segment joining section 323 replaces the crosspoint signal value zc1 with the point p102. Then, to the point p102, the line segment joining section 323 adds a value which is obtained by subtracting the immediately previous crosspoint signal value zc1 from the digital value of the intermediate signal. Based on the length of the line segments of the subdivision signals having been joined by the line segment joining section 323, the position estimation device 30 estimates a mechanical angle position of the rotor.

Specific examples of information to be stored in the storage device 33 will be described.

The storage device 33 stores a relationship between numbers of pole pairs, sections, and segments. Moreover, the storage device 33 stores relative magnitudes of the three detection signals Hu0', Hv0' and Hw0' for each section. The relative magnitudes of the detection signals Hu0', Hv0' and Hw0' and their relative magnitudes with respect to the reference value are used to determine the ordinal numbers of sections.

In the method of position estimation according to the present embodiment, a detection signal is divided into two segments at a zero-crossing. As a result of this, one round of mechanical angle contains 72 subdivision signals. Consequently, in the method of position estimation according to the present embodiment, one subdivision signal has a short length. This allows the combined subdivision signals to become closer to a more ideal linear signal which is proportional to angles. Moreover, in the method of position estimation according to the present embodiment, positions (as angle information of the rotor R) are obtained on the basis of subdivision signals of near-linear shapes. Since the position estimation device 30 estimates a position of the rotor R by using line segments thus joined, the present embodiment is able to achieve a highly precise position detection, without requiring a high-precision optical encoder.

The motor module 1000 is able to perform position control by using a mechanical angle $\Theta\hat{\,}$ which has been estimated in this manner. In the method of position estimation according to the present embodiment, the detection device to detect the position of the rotor R does not require any encoder that is susceptible to influences of the environment. This allows the motor to be downsized, and the precision of position control is not susceptible to influences of the environment, e.g., dust particles. Moreover, the estimated position signal is not discrete pulse signals. Since the changes in the magnitude of the estimated position signal follow a straight line, positioning of the rotor (mover) is possible with an arbitrary level of resolution.

Note that generation of an estimated position value is not limited to the above-described method. What is important is that the estimated position signal has a magnitude which linearly changes in accordance with the position of the rotor R, rather than being discrete pulse signals.

[Variants]

In the present embodiment, an example has been described where crossings and zero-crossings are detected, and any detection signal between a crossing and a zero-crossing is detected as a subdivision signal. However, embodiments of the present disclosure are not limited thereto. For example, the subdivision detection device 322 may extract any detection signal from a crossing to a crossing which is adjacent to that crossing, as a subdivision signal. Then, the subdivision detection device 322 may subdivide the extracted subdivision signal into two subdivision signals at a zero-crossing that is located between the crossing and the crossing which is adjacent to that crossing.

In the present embodiment, an example has been described where the position calculating section 32 applies the respective processes to the detection signals Hu0', Hv0' and Hw0' having been converted into digital signals. However, embodiments of the present disclosure are not limited thereto. For example, the position calculating section 32 may apply the respective processes to the detection signals Hu0, Hv0 and Hw0 as analog signals.

The method of driving the motor M may be a vector control technique, or any other driving technique, for example. Other methods of driving may be, for example, driving techniques using 120-degree rectangular waves or sine waves.

Without being limited to 12 poles, the number of poles in the motor M may be e.g. 2 poles, 4 poles, 8 poles, and so on. For example, in the case of an 8-pole motor, one cycle of mechanical angle contains subdivision signals which are worth four cycles of electrical angle. In this case, if the detection device outputs three-phased detection signals, one cycle of electrical angle contains 12 subdivision signals; therefore, one cycle of mechanical angle contains 48 (=12× 4) subdivision signals. In the case of an 8-pole motor and if the rotor R is undergoing CW rotation, the line segment joining section 323 may sequentially combine 48 subdivision signals in the forward direction. As used herein, CW means clockwise rotation as viewed from the output shaft.

Moreover, the forward direction is a direction in which the digital value increases with increase in the rotor angle.

If the rotor R is undergoing CCW rotation, at step S104, the line segment joining section 323 may allow subdivision signals which are worth one cycle of mechanical angle to be joined in the backward direction. As used herein, CCW means counterclockwise rotation as viewed from the output shaft. The backward direction is a direction in which the digital value decreases with increase in the rotor angle. The line segment joining section 323 may allow the joined subdivision signals, which are worth one cycle of mechanical angle, to be sequentially joined in the descending direction from 360 [degM] to 0 [degM], with increase in the rotor angle. In this case, the position estimation device 30 determines whether the rotor R is undergoing CW rotation or CCW rotation. The determination is possible because changes occur in the relative magnitudes of the three detection signals Hu0', Hv0' and Hw0' as stored in the storage device 33. According to this embodiment, irrespective of whether the rotor R is undergoing CW rotation or CCW rotation, the position of the rotor R can be estimated with good precision.

The relationship between the rotation direction and the detection signals will be described with reference to FIG. 16.

If the current position is between the rotor angles θ105 and θ107, the position estimation device 30 causes the storage device 33 to store a digital value as taken on the vertical axis at the current position, and a digital value as taken on the vertical axis at the rotor angle θ105, which is the immediately previous crossing, for example.

In the case where the rotor R is undergoing CW rotation, the position of the rotor R will move to between the rotor angles θ107 and θ109. The position estimation device 30 detects a transition in the intermediate signal when switching from the detection signal Hv0' to the detection signal Hu0', and detects whether the intermediate signal after the transition is positive or negative with respect to a reference value, thus judging that the rotor R is undergoing CW rotation. Then, the position estimation device 30 causes the subdivision signals sg107 and sg108 between the rotor angles θ107 and θ109 to be joined to the subdivision signal sg106 in the forward direction.

On the other hand, in the case where the rotor R is undergoing CCW rotation, the position of the rotor R will move to between the rotor angles θ103 and θ105. The position estimation device 30 detects a transition in the intermediate signal when switching from the detection signal Hv0' to the detection signal Hw0', and detects whether the intermediate signal after the transition is positive or negative with respect to a reference value, thus judging that the rotor R is undergoing CCW rotation. Then, the position estimation device 30 causes the subdivision signals sg103 and sg104 between the rotor angles θ103 and θ105 to be joined to the subdivision signal sg105 in the backward direction.

The sensors in the detection device 150 are not limited to Hall generators. The sensors used in the detection device 150 may produce detection signals which are sine waves, or output signals that are based on sine waves but contain harmonics. For example, the sensors in the detection device 150 may be sensors utilizing magnetoresistance.

The subdivision detection device 322 may generate a line segment from a crossing to a zero-crossing which is adjacent to that crossing, or from a zero-crossing to a crossing which is adjacent to that zero-crossing, thereby extracting a subdivision signal. The line segment may be a straight line, or a portion of a sine wave, for example.

Without being limited to an outer rotor example, the motor M may be a brushed motor such that slots are parts of the rotor R. Furthermore, as described earlier, the motor M may be a linear motor.

The number of sensors in the detection device 150 is not limited to three. The outputs from the sensors may be displaced in phase by an angle determined through division by the total number of sensors.

Although the present embodiment has described an example where the crossing detection device 321 detects crossings and zero-crossings, this is not a limitation. The crossing detection device 321 may only detect crossings. In this case, the subdivision detection device 322 may sequentially detect a portion of a detection signal from a crossing to a crossing which is adjacent to that crossing as a subdivision signal. In this case, the number of subdivision signals which are worth one cycle of electrical angle is six. When the number of pole pairs in the motor M is six, the number of subdivision signals which are worth one cycle of mechanical angle is 36.

When an optical encoder is used in detecting a rotary position of the rotor R as in the conventional techniques, the precision of detection will depend on the resolution of the encoder. Herein, the optical encoder may include a photointerrupter and an encoder disk, for example. The encoder disk has slits which are made at equal intervals along the circumference. For example, an encoder with a resolution of 400 pulses has a precision of detection of about ±0.9 degrees.

In the present application, a crossing position, a zero-crossing, and a subdivision signal being "detected" implies that a crossing position and a zero-crossing are detected as a result of calculating a crossing position, a zero-crossing, and a subdivision signal in the position estimation device.

Note that a program for realizing the functions of a motor control device including the position estimation device may be recorded on a computer-readable storage medium not shown, and the program record on this storage medium may be loaded to a computer system for execution, thereby carrying out the procedure of each process. As used herein, a "computer system" encompasses an OS and any hardware such as peripheral devices. A "computer-readable storage medium" means a portable medium such as a flexible disk, a magneto-optical disk, a memory card having a flash memory mounted thereon, or a CD-ROM, as well as a storage device such as a hard disk that is internalized in a computer system. Furthermore, a "computer-readable storage medium" encompasses that which retains a program for a certain period of time, e.g., a volatile memory (RAM) inside a computer system that serves as a server or a client when a program is transmitted via a network such as the Internet or a telecommunication lines such as a telephone circuit.

The aforementioned program may be transmitted from a computer system having this program stored in a storage device or the like to another computer system, via a transmission medium or by a propagating wave within a transmission medium. As used herein, a "transmission medium" with which to transmit the program means a medium having the function of transmitting information, e.g., a network (communications network) such as the Internet, or telecommunication lines (communication lines) such as a telephone circuit. The aforementioned program may be adapted to realize some of the aforementioned functions. It may also be something that realizes the aforementioned functions in combination with a program that is already recorded within the computer system, i.e., a so-called difference file (difference program).

The motor control device 100 according to the present disclosure can be implemented by using a signal processing circuit and a storage medium storing a computer program which controls the operation of this signal processing circuit. Hereinafter, such an embodiment will be described.

Figure 19:
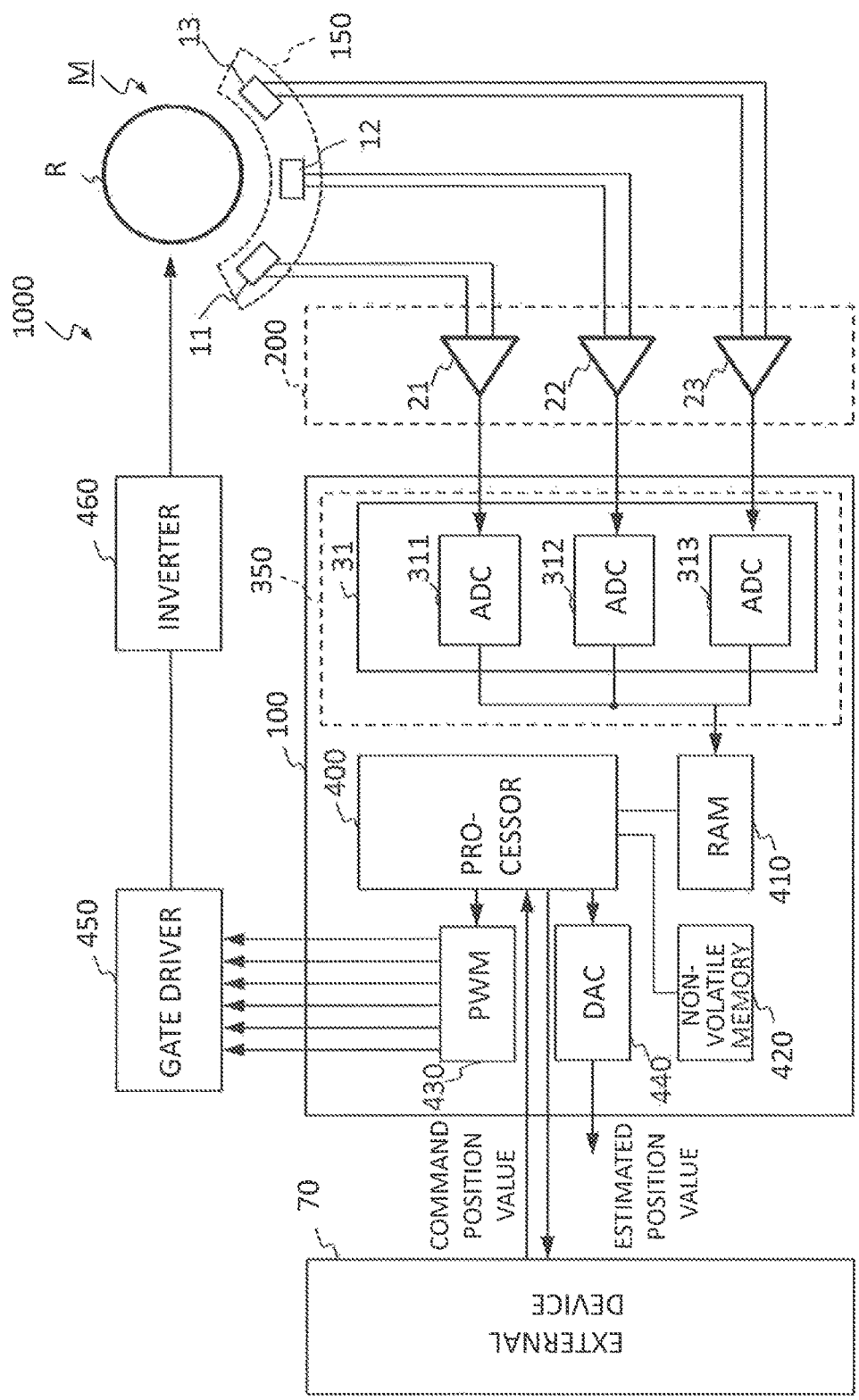
FIG. 19 is a schematic diagram showing another exemplary construction of the motor module 1000 according to an embodiment.

FIG. 19 is a schematic diagram showing another exemplary construction of the motor module 1000 according to the present embodiment. As shown in FIG. 19, the motor module 1000 according to the present embodiment includes a motor M, a detection device 150, an amplification circuit 200, a position estimation device 300, a gate driver 450, an inverter 460, and a controller 500. The motor module 1000 receives an external signal, e.g., a pulse signal, from the external device (controller) 70, and based on this external signal, controls the operation of the motor M. In the example shown in FIG. 19, all or part of the above-described motor control circuit 20 and the position estimation device 30 is implemented by the signal processing circuit 400.

The detection device 150 includes N (where N is an integer of 3 or more) sensors that detect magnetic fields which are created by a plurality of magnetic poles possessed by the rotor R, the N sensors each outputting a detection signal having a magnitude which is in accordance with an intensity of a detected magnetic field. The N sensors are disposed so that the N detection signals are displaced in phase by an angle which is 360 degrees/N. In the example shown in the figure, N is 3, and the detection device 150 includes sensors 11, 12 and 13. The construction and operation of the motor M, the detection device 150, and the amplification circuit 200 in the present embodiment are as have already been described, and their detailed description will not be repeated here.

The illustrated motor control device 100 includes a preprocessing circuit 350 which generates N corrected detection signals from the N detection signals, and a signal processing circuit 400 which performs various signal processes. The signal processing circuit 400 according to the present embodiment may be an integrated circuit (IC) chip such as a central processing unit (CPU) or a digital signal processor. The motor control device 100 includes a storage medium having stored thereon a computer program to control an operation of the signal processing circuit 400. This storage medium, which may be a non-volatile memory 420 such as a flash ROM, is connected to the signal processing circuit 400. The N corrected detection signals which are output from the preprocessing circuit 350 are stored as variables to the RAM 410 in a timely manner.

The preprocessing circuit 350 includes the aforementioned AD converter 31, and may optionally include circuitry for performing processes such as correction or normalization for the output from the AD converter 31. By the preprocessing circuit 350, detection signals are converted into digital signals and are subjected to various correction processes. Herein, those detection signals which have been subjected to such preprocessing will be referred to as "corrected detection signals".

In order to function as a position estimation device, the signal processing circuit 400 performs the following steps in accordance with instructions in the computer program.

First, the signal processing circuit 400 reads the corrected detection signals from the RAM 410. Next, a crossing at which two signals among the N corrected detection signals cross each other is sequentially detected.

The signal processing circuit 400 subdivides a corrected detection signal that links from a crossing to another crossing which is adjacent to that crossing into one or more segments, and detects each segment as a subdivision signal.

The signal processing circuit 400 reads measurement data in which a moved amount of the rotor corresponding to each segment is associated with every segment, from a storage device. This storage device may be the storage medium in which the aforementioned computer program is stored, or another storage device such as a memory card. In the present embodiment, measurement data is retained in the non-volatile memory 420, and is read from the non-volatile memory 420. This measurement data is acquired via offline processing prior to shipment, and is retained in the storage medium. After shipment, the measurement data may be updated.

By referring to this measurement data, the signal processing circuit 400 identifies a segment that corresponds to a current position of the rotor R, based on the relationship among the N corrected detection signals and on the subdivision signals.

In an implementation where the following conditions are satisfied, the relationship $\Theta[n]=\Theta \text{offset}[i]+k[i]\times X[n]$ holds true: i is an integer which is 1 or greater; n is an integer which defines a current point in time; i is an ordinal number of the identified segment; $\Theta \text{offset}[i]$ is a position of the rotor R at a start point of the identified segment; $X[n]$ is a difference between a value of a subdivision signal at the start point of the segment and a current value of the subdivision signal; $\Theta[n]$ is an estimated position value of the rotor R; and $k[i]$ is a factor of proportionality. The estimated position value of the rotor R is determined from this relationship.

The signal indicating the estimated position value of the rotor R has a value which linearly increases in proportion to a moved amount of the rotor R from the reference position. In a preferable implementation, the signal indicating the estimated position value of the rotor R has a digital value or an analog value which is in proportion to $\Theta$.

Thus, based on the identified segment, the signal processing circuit 400 determines an estimated position value of the rotor from the levels of the subdivision signals, and generates a signal indicating an estimated position value. The estimated position signal may be input to a feedback (F/B) terminal of the controller 500 in the form of a digital value. The estimated position signal may be output to the exterior as serial data, or converted by a DA conversion circuit (DAC) 440 into an analog value and then output. For example, during maintenance, the signal which has been converted into an analog value may be observed with an oscilloscope, whereby a comparison between a command position value and the estimated position value would be possible.

As for the operation to be executed by the signal processing circuit 400, reading measurement data in which a moved amount of the rotor corresponding to each segment is associated with every segment from the storage device is not an indispensable operation to the present embodiment. Moreover, by referring to this measurement data, identifying a segment that corresponds to a current position of the rotor, based on the relationship among the N corrected detection signals and on the subdivision signals, is not an indispensable operation to the present embodiment. Instead of executing these operations, the signal processing circuit 400 may determine an estimated position value of the rotor from the levels of the subdivision signals, and output a signal indicating an estimated position value based on a plurality of subdivision signals having been sequentially joined.

Furthermore, when functioning as a command position value generation circuit, the signal processing circuit 400 follows instructions from the computer program. First, from the memory, the signal processing circuit 400 acquires variable step-size information that defines an amount of displacement of the rotor per pulse of a pulse signal that is input from the external device. Next, upon receiving a pulse signal from the external device, a command position value is generated based on the estimated position value of the rotor as obtained through the aforementioned method and the variable step-size information.

By using the command position value thus generated, the signal processing circuit 400 performs known calculations that are necessary for motor control, e.g., vector control, and supplies a PWM signal from the PWM circuit 430 to the gate driver 450. Based on the PWM signal, the gate driver 450 opens or closes switching transistors in the inverter 460, and supplies a necessary voltage and current to the motor M.

Note that the estimated position signal may be input to a feedback (F/B) terminal (not shown) of the external device 70 in the form of a digital value. The estimated position signal may be output to the exterior as serial data, or converted by a DA conversion circuit (DAC) 440 into an analog value and then output. For example, during maintenance, the signal which has been converted into an analog value may be observed with an oscilloscope, whereby a comparison between a command position value and the estimated position value would be possible.

The various processes to be executed by the signal processing circuit 400 do not need to be executed by a single IC chip. The different processes to be executed by the respective functional blocks may be split among a plurality of processing units or digital signal processors (DSP). Moreover, the signal processing circuit 400 according to the present embodiment may be implemented by using a programmable logic device such as an FPGA (Field-Programmable Gate Array).

In acquiring or updating measurement data when offline, the signal processing circuit 400, the rotor R moves (rotate) at a constant speed in accordance with an instruction in the computer program. Then, it measures a moving (rotating) time of the rotor R for each segment, and generates data in which a moved amount (mechanical angle) of the rotor R corresponding to each segment is associated with every segment. The signal processing circuit 400 causes this data to be stored to the non-volatile memory 420 as measurement data.

INDUSTRIAL APPLICABILITY a motor module according to the present disclosure may replace a stepping motor that is widely used in devices such a printers, scanners, copiers, and multifunction products.

REFERENCE SIGNS LIST

10 . . . motor driving circuit, 11, 12, 13 . . . sensor, 20 . . . motor control circuit, 21, 22, 23 . . . differential amplifier, 30 . . . position estimation device, 31 . . . AD converter, 311, 312, 313 . . . AD conversion circuit, 321 . . . crossing detection device, 322 . . . subdivision detection device, 323 . . . line segment joining section, 33 . . . storage device, 40 . . . variable step-size memory, 50 . . . motor control device, 60 . . . motor driving circuit, 70 . . . external device, 72 . . . stepping motor controller, 74 . . . upper controller, 100 . . . motor control device, 150 . . . detection device, 200 . . . amplification circuit, M . . . motor, 500 . . . signal processing circuit, 520, 520A, 520B . . . command position value generation circuit, 540 . . . arithmetic unit, 545 . . . estimated speed value generation circuit, 550a . . . comparator, 550b . . . comparator, 560 . . . command speed value generation circuit, 570 . . . PWM signal generation circuit, 1000 . . . motor module

The invention claimed is:

1. A motor module comprising:
   a motor having a mover and a stator;
   a motor driving circuit to drive the motor;
   a position estimation device to output an analog or digital estimated position signal indicating an estimated position value of the mover;
   a motor control circuit being connected to the motor driving circuit to supply a command voltage value to the motor driving circuit in response to a pulse signal; and
   a memory storing variable step-size information, the variable step-size information defining an amount of displacement of the mover per pulse of the pulse signal, wherein,
   upon receiving the pulse signal, the motor control circuit determines the command voltage value based on the estimated position value of the mover acquired from the position estimation device and the variable step-size information read from the memory; and
   the motor driving circuit changes a position of the mover based on the command voltage value.

2. The motor module of claim 1, wherein the motor control circuit generates a command position value based on the variable step-size information and the pulse signal, and determines the command voltage value based on the command position value and the estimated position value.

3. The motor module of claim 2, wherein,
   the motor control circuit outputs a command position value expressed by the equation $\theta^* = \theta_{set} \times N\_STMP \times Dir + \theta$, where
   $\theta^*$ represents the command position value;
   $\theta$ represents the estimated position value of the mover;
   $\theta_{set}$ represents an amount of displacement of the mover per pulse of the pulse signal;
   N_STMP represents a number of pulse counts in the pulse signal that is input from the external device within a designated period; and
   Dir represents a designated direction of displacement of the mover, such that Dir=1 when the direction of displacement is a first direction and Dir=−1 when the direction of displacement is a second direction which is opposite to the first direction.

4. The motor module of claim 1, wherein the motor control circuit generates a command position value and a command speed value based on the variable step-size information and the pulse signal and generates an estimated speed value from the estimated position value, and determines the command voltage value based on the command position value and estimated position value and on the command speed value and estimated speed value.

5. The motor module of claim 1, wherein the motor is a brushless DC motor.

6. The motor module of claim 1, wherein the estimated position signal that is output from the position estimation device has a magnitude which linearly changes in accordance with the position of the mover.

7. The motor module of claim 1, wherein,
   the memory stores at least one value to be read as the variable step-size information; and during boot or operation, the motor control circuit reads the at least one value from the memory.

8. The motor module of claim 1, wherein,
the memory stores a plurality of candidate values to be read as the variable step-size information;
the plurality of candidate values respectively define different amounts of displacement of the mover per pulse of the pulse signal; and
during boot or operation, the motor control circuit selectively reads one of the plurality of candidate values from the memory, in accordance with an internal program or an external instruction.

9. The motor module of claim 1, wherein,
the memory stores a plurality of candidate values to be read as the variable step-size information;
the plurality of candidate values respectively define different amounts of displacement of the mover per pulse of the pulse signal; and
the motor control circuit includes a pin or a switch for selecting an arbitrary one among the plurality of candidate values.

10. The motor module of claim 1, wherein, during boot or operation, the motor control circuit changes the amount of displacement of the mover per pulse of the pulse signal, in accordance with an internal program or an external instruction.

11. The motor module of claim 1, further comprising an interface for updating the variable step-size information stored in the memory.

12. An apparatus comprising:
the motor module of claim 1;
a mechanical part connected to the motor of the motor module; and
a controller to input the pulse signal to the motor control circuit.

13. A motor step operation control system comprising:
a motor driving circuit to drive a motor having a mover and a stator;
a position estimation device to output an analog or digital estimated position signal indicating an estimated position value of the mover;
a motor control circuit being connected to the motor driving circuit to supply a command voltage value to the motor driving circuit in response to a pulse signal; and
a memory storing variable step-size information, the variable step-size information defining an amount of displacement of the mover per pulse of the pulse signal, wherein,
upon receiving the pulse signal, the motor control circuit determines the command voltage value based on the estimated position value of the mover acquired from the position estimation device and the variable step-size information read from the memory; and
the motor driving circuit changes a position of the mover based on the command voltage value.

14. A motor control device for use while being connected to a motor driving circuit which drives a motor having a mover and a stator and to a position estimation device which outputs an analog or digital estimated position signal indicating an estimated position value of the mover, the motor control device comprising:
a control circuit to generate a command voltage value based on a command position value and the estimated position value, and supply the command voltage value to the motor driving circuit;
a memory storing variable step-size information, the variable step-size information defining an amount of displacement of the mover per pulse of a pulse signal that is input from an external device; and
a command position value generation circuit to generate the command position value based on the pulse signal and the variable step-size information.

15. A step operation control method for a motor having a mover and a stator, the step operation control method comprising:
with a motor control device, generating an analog or digital estimated position signal indicating an estimated position value of the mover;
with the motor control device, acquiring variable step-size information from a memory, the variable step-size information defining an amount of displacement of the mover per pulse of a pulse signal that is input from an external device;
with the motor control circuit, receiving a pulse signal from the external device, and generating the command voltage value based on the estimated position value of the mover and the variable step-size information; and
with the motor driving circuit, changing a position of the mover in variable steps, based on the command voltage value.

16. The step operation control method of claim 15, comprising, during boot or operation of the motor, causing the motor control device to modify the variable step-size information.

* * * * *